US012111354B2

(12) United States Patent
Liao et al.

(10) Patent No.: US 12,111,354 B2
(45) Date of Patent: Oct. 8, 2024

(54) DETECTION CIRCUIT OF CLOCK ANOMALY AND METHOD, CLOCK CIRCUIT, CHIP AND RADAR

(71) Applicant: SUTENG INNOVATION TECHNOLOGY CO., LTD., Shenzhen (CN)

(72) Inventors: Yumin Liao, Shenzhen (CN); Junling Zang, Shenzhen (CN); Yueqing Yang, Shenzhen (CN)

(73) Assignee: SUTENG INNOVATION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/131,344

(22) Filed: Apr. 5, 2023

(65) Prior Publication Data
US 2023/0324460 A1  Oct. 12, 2023

(30) Foreign Application Priority Data

Apr. 8, 2022  (CN) .......................... 202210364370.8

(51) Int. Cl.
*G01R 31/317*  (2006.01)
(52) U.S. Cl.
CPC .............................. *G01R 31/31727* (2013.01)
(58) Field of Classification Search
CPC ............................................... G01R 13/31727
See application file for complete search history.

(56) References Cited

U.S. PATENT DOCUMENTS

| 2010/0020909 | A1* | 1/2010 | Jung | H04J 3/0667 |
| | | | | 375/371 |
| 2013/0077642 | A1* | 3/2013 | Webb, III | H04J 3/0661 |
| | | | | 370/503 |
| 2013/0182806 | A1* | 7/2013 | Obradovic | H04L 7/04 |
| | | | | 375/356 |
| 2015/0312078 | A1* | 10/2015 | Bogdan | H04L 7/0087 |
| | | | | 375/226 |
| 2023/0388171 | A1* | 11/2023 | Bogdan | H03H 17/0251 |
| 2024/0085942 | A1* | 3/2024 | Abdelhameed | G06F 1/10 |

* cited by examiner

*Primary Examiner* — Samir W Rizk
(74) *Attorney, Agent, or Firm* — BAYES PLLC

(57) ABSTRACT

A detection circuit of clock anomaly and method, a clock circuit, a chip, and a radar are provided. The detection circuit of clock anomaly includes: a first clock frequency determining unit, configured to determine a first clock frequency of a received first clock signal; a reference determining unit, configured to determine a reference corresponding to the first clock signal, where the reference is determined based on a second clock signal or a timestamp; and a clock anomaly detection unit, connected to the first clock frequency determining unit and the reference determining unit separately and configured to perform anomaly detection on the first clock signal based on the first clock frequency and the reference. This application can improve reliability of the clock signal, thereby improving personal safety and property safety of a user.

9 Claims, 19 Drawing Sheets

DETECTION CIRCUIT OF CLOCK ANOMALY AND METHOD, CLOCK CIRCUIT, CHIP AND RADAR

CROSS-REFERENCE TO RELATED APPLICATION

The present application claims the benefit of priority to China Patent Application No. 202210364370.8, filed on Apr. 8, 2022, the contents of which are incorporated herein by reference in its entirety.

TECHNICAL FIELD

This application relates to the field of computer technologies, and in particular, to a detection circuit of clock anomaly and method, a clock circuit, a chip and a radar.

BACKGROUND

With rapid development of computer technologies, information technologies, and the like, circuits are becoming increasingly important in daily life and work of users. As timers in circuits, clock signals can ensure synchronous operation of related electronic components, to further implement preset functions of the circuits.

Using autonomous driving technologies as an example, radars can collect ambient information, so that an autonomous driving decision-making system can use a driving policy such as obstacle avoidance that matches the ambient information. A clock generating unit of a main control chip of the radar is responsible for providing the main control chip and at least some functional circuits with clock signals required for work. Therefore, the clock signal is an important signal upon which functions of multiple digital circuits depend. The applicant has found that the clock generating unit may physically fail due to factors such as manufacturing processes or aging, or the clock generating unit may be hacked or controlled by a hacker, thereby causing radar function failures, and leaving personal safety and property safety of the users unprotected.

SUMMARY

This application provides a detection circuit of clock anomaly and method, a clock circuit, a chip, and a radar, which can detect clock anomaly and improve reliability of a clock signal, thereby improving personal safety and property safety of a user.

A first aspect of this application provides a detection circuit of clock anomaly, including: a first clock frequency determining unit, a reference determining unit, and a clock anomaly detection unit. The first clock frequency determining unit is configured to determine a first clock frequency of a received first clock signal. The reference determining unit is configured to determine a reference corresponding to the first clock signal, where the reference is determined based on a second clock signal and/or a timestamp. The clock anomaly detection unit is connected to the first clock frequency determining unit and the reference determining unit separately and configured to perform anomaly detection on the first clock signal based on the first clock frequency and the reference.

A second aspect of this application provides a clock circuit, including a first clock generating unit and the foregoing detection circuit of clock anomaly. Herein, the first clock generating unit is configured to output a first clock signal. The detection circuit of clock anomaly is connected to the first clock generating unit and configured to detect the first clock signal.

A third aspect of this application provides a chip, including a functional circuit and at least one of the following: the foregoing clock circuit or a detection circuit of clock anomaly. Herein, the functional circuit is configured to implement a specific function based on the first clock signal or the second clock signal.

A fourth aspect of this application provides a board, including the foregoing detection circuit of clock anomaly, clock circuit or chip.

A fifth aspect of this application provides a radar, including at least one of the foregoing detection circuit of clock anomaly, clock circuit, chip or board.

A sixth aspect of this application provides a clock anomaly detection method, including: determining a reference corresponding to a first clock signal; determining a first clock frequency of the first clock signal based on the reference; and performing anomaly detection on the first clock signal based on the reference and the first clock frequency, where the reference is determined based on a second clock signal and/or a timestamp.

A seventh aspect of this application provides an electronic device, including: a processor and a memory, storing executable code, where when being executed by the processor, the executable code enables the processor to perform the foregoing method.

An eighth aspect of this application provides a computer-readable storage medium storing executable code, wherein when the executable code is executed by a processor of an electronic device, the processor is enabled to perform the foregoing method.

A ninth aspect of this application provides a computer program product, including executable code, wherein when the executable code is executed, the foregoing method is implemented.

The technical solution provided in this application may have the following beneficial effects:

In some embodiments of this application, the reference can be determined for the first clock signal based on the second clock signal and/or the timestamp, to facilitate anomaly detection of the first clock frequency of the first clock signal via the reference. In these embodiments, reliability of the first clock signal can be detected to perform anomaly detection on the clock circuit, thereby improving the reliability of the clock signal and improving the personal safety and the property safety of the user.

In some embodiments of this application, the reference can be the reference time period, and the reference time period can be a statistical value for the pulses of the reference clock signal, to determine whether the number of generated pulses of the first clock signal within the first reference time period is normal based on the number of pulses of the reference clock signal in the first reference time period, thereby detecting the first clock signal. In addition, the reference time period may also be specific to the number of pulses that should be generated in the first clock signal within a time period between any two timestamps. For example, because the preset clock frequency of the first clock signal is known, the number of pulses that should be generated in the first clock signal within the time period between any two timestamps can be calculated. Therefore, it can be determined whether the first clock signal is abnormal by comparing the number of pulses that are actually generated in the first clock signal with the number of pulses that should be generated in the first clock signal within the foregoing time period.

In some embodiments of this application, the enabling signal and the counting ending instruction provided by the counting control unit can be used to ensure synchronous counting and synchronous counting ending of two counters, to ensure precision of a counting result, thereby improving precision of the detection result.

In some embodiments of this application, a threshold corresponding to the number of pulses may be set or modified, to meet diverse requirements of the user. In addition, when a specific clock signal is abnormal, anomaly handling can be performed, and redundant clock signals can be provided to improve system reliability.

In some embodiments of this application, an exclusive second clock generating unit is disposed in the detection circuit of clock anomaly. This can effectively reduce a probability of affecting the reference clock signal when the first clock generating unit is attacked, and effectively prompt reliability of the detection result.

It should be understood that the foregoing general descriptions and the following detailed descriptions are only exemplary and explanatory and impose no limitation on this application.

BRIEF DESCRIPTION OF DRAWINGS

Exemplary embodiments of this application are described with reference to the accompanying drawings, to illustrate the foregoing and other objectives, features, and advantages of this application. In the exemplary embodiments of this application, the same reference numerals generally represent the same components.

DETAILED DESCRIPTION

Figure 1:
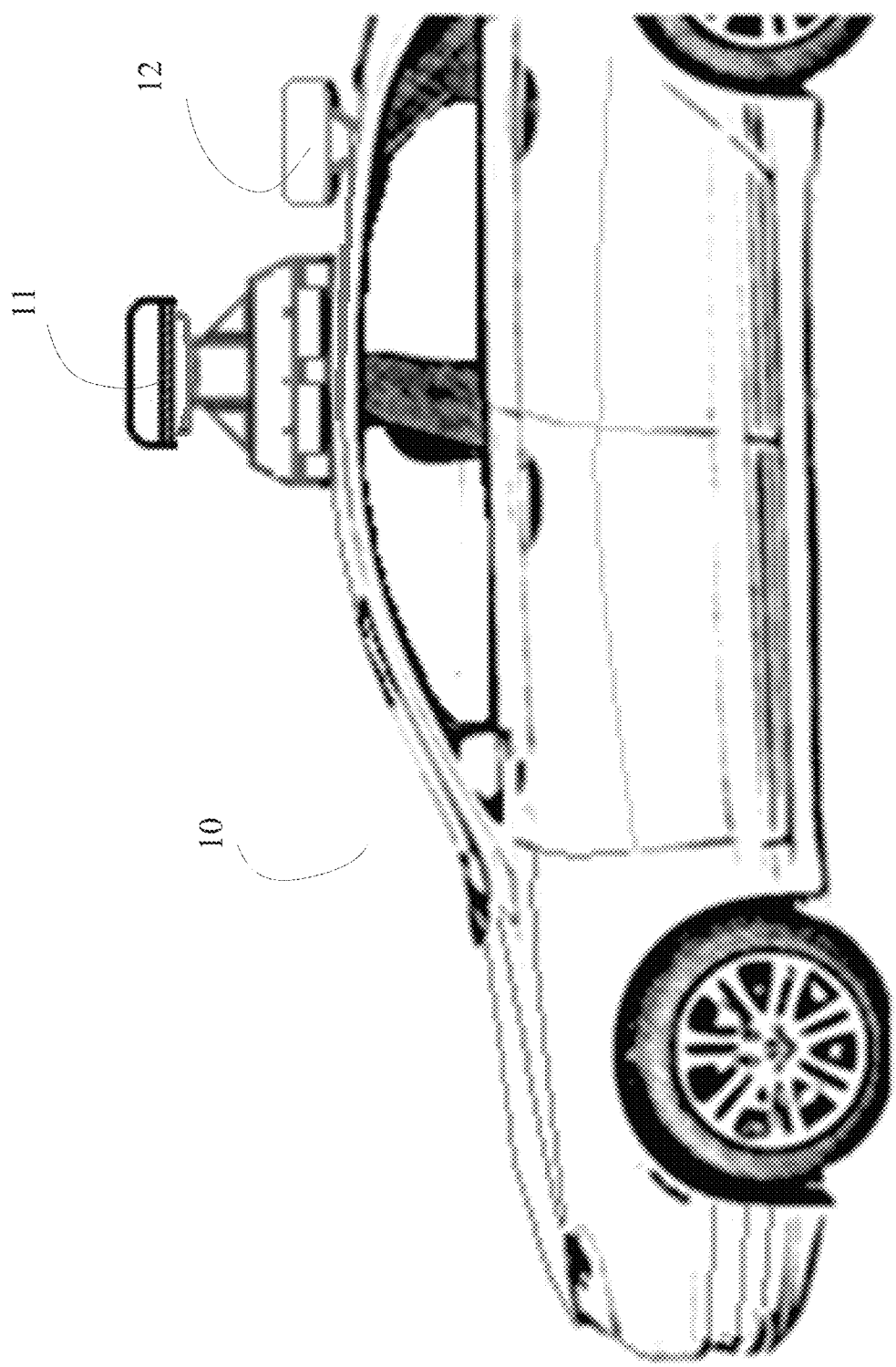
FIG. 1 is a schematic diagram of an application scenario of a detection circuit of clock anomaly and method, a clock circuit, a chip, and a radar according to some embodiments of this application.

The following describes embodiments of this application with reference to the accompanying drawings. Although the embodiments of this application are shown in the accompanying drawings, it should be understood that this application may be implemented in various forms and should not be limited by the embodiments illustrated herein. On the contrary, the embodiments are provided for a better understanding of this application to a person skilled in the art.

The terms used in the embodiments of this application are merely for the purpose of illustrating specific embodiments, but are not intended to limit this application. The terms "a/an" and "the" of singular forms used in this application and the appended claims are also intended to include plural forms, unless otherwise specified in the context clearly. It should be further understood that the term "and/or" used in this specification refers to any combination of one or more of the associated items listed and all possible combinations thereof.

It should be understood that although the terms "first", "second", third", and the like are used to describe various types of information in this application, the information should not be limited to these terms. The terms are only used to distinguish between information of the same type. For example, without departing from the scope of this application, first information may also be referred to as second information, and similarly, second information may also be referred to as first information. Therefore, a feature with a determiner such as "first" or "second" may expressly or implicitly include one or more features. In the description of this application, "multiple" means two or more, unless otherwise specifically defined.

For ease of understanding of this application, some concepts involved in this application are described first.

Vehicle-mounted radar: The vehicle-mounted radar has a detection distance of 200 meters to 500 meters, has identifiable physical features including a distance and reflectivity, and can be applied to small machines such as a vehicle and a robot. The vehicle-mounted radar includes vehicle-mounted LiDAR, a vehicle-mounted millimeter-wave radar, a vehicle-mounted ultrasonic radar, and the like.

Vehicle-mounted LiDAR: The vehicle-mounted LiDAR emits an outgoing light (such as a laser beam) with a wavelength of about 900 nm, the outgoing light is reflected by an obstacle after being incident on an obstacle, and a processing unit calculates a distance between the obstacle and the vehicle-mounted LiDAR based on a time difference between reflected light and the outgoing light. In addition, the processing unit can also estimate reflectivity of the target based on a cross-section of a reflected light signal obtained after receiving the reflected light. The vehicle-mounted LiDAR is highly integrated due to its compact size.

In an autonomous driving scenario, a system architecture applicable to the autonomous driving scenario can include a mobile device, a network, and cloud.

The cloud can include a server cluster or a distributed system having multiple physical servers. The cloud can be a cloud server for providing basis cloud computing services, for example, a cloud service, a cloud database, cloud computing, a cloud function, cloud storage, a network service, cloud communication, a middleware service, a domain name service, a security service, a content delivery network (CDN), big data, and an artificial intelligence platform.

The mobile device includes, but is not limited to, a vehicle, a ship, a robot, or an aircraft. The mobile device may be provided with an electronic device such as a sensor, to obtain obstacle information and the like in an ambient environment of the mobile device. The electronic device can include the radar (including the LiDAR), an image sensor, or the like. Various electronic devices require clock signals during operation or communication.

Embodiments of this application provide a detection circuit of clock anomaly and method, a clock circuit, a chip, and a radar. Anomaly detection is performed on a first clock signal based on a first clock frequency of the first clock signal and a reference, where the reference can be determined based on a second clock frequency of a second clock signal, or the reference can be determined based on a number of pulses that should exist between two timestamps. With the provided reference, the clock signal can be detected to ensure reliability of the clock signal, improve reliability of a circuit used by a user, and further ensure personal safety and property safety of the user in a scenario such as assisted or autonomous driving.

The following describes in detail the technical solution in the embodiments of this application with reference to the accompanying drawings.

FIG. 1 is a schematic diagram of an application scenario of a detection circuit of clock anomaly and method, a clock circuit, a chip, and a radar according to some embodiments of this application.

FIG. 1 shows hardware configuration of a vehicle 10 supporting a driving assistance function or an automated driving function. For example, at least one LiDAR (Light Detection and Ranging) 11 is mounted on a roof and/or a side of the vehicle 10. A detection region of the LiDAR 11 may be fixed. For example, one specific LiDAR 11 may be only configured to detect a specific preset region. The detection region of the LiDAR 11 can be adjusted. For example, the LiDAR on the vehicle can scan multiple detection regions by adjusting attitude, an angle of view range of the LiDAR or the like. In some embodiments, the vehicle 10 may be mounted with 5 LiDARs 11 on the roof, the front part, the rear part, the left part, and the right part of the vehicle. Multiple LiDARs 11 can detect an outline of an object in a region adjacent to the vehicle and a distance between the vehicle and the object.

In addition, a photographing apparatus may be mounted on the vehicle 10. The photographing apparatus can photograph a front environment at a set angle. For example, the photographing apparatus may be a monocular camera, multi-ocular cameras, or the like.

In addition, multiple millimeter-wave radars may be further mounted on the vehicle 10 while encircling the vehicle 10. For example, four millimeter-wave radars are mounted on the vehicle 10, and have detection ranges of a left front side, a right front side, a left rear side, and a right rear side of the vehicle. The millimeter-wave radar can detect a distance between the vehicle and an object existing in each detection region, and can detect a relative speed of the object and the vehicle 10.

Further, a positioning device 12 may also be mounted on the vehicle 10, for example, a Beidou positioning device or Global Positioning System (GPS). A current position of the vehicle 10 can be determined via the positioning device 12.

In addition, an electronic control unit (ECU) may also be mounted on the vehicle 10. A detection signal of at least one of the foregoing LiDAR 11, the millimeter-wave radar, and the positioning device 12 is sent to the ECU. The ECU can detect and identify an obstacle (for example, a roadblock, a moving object, a tree, or an adjacent vehicle around the vehicle 10) based on these signals. In addition. ECUs can be physically classified into multiple types according to their functions, and are collectively referred to as ECUs in this application.

It should be noted that although the mobile device is described as the vehicle, such description is not exclusive, and is applicable to various mobile devices, for example, a land robot and a water robot.

Figure 2:
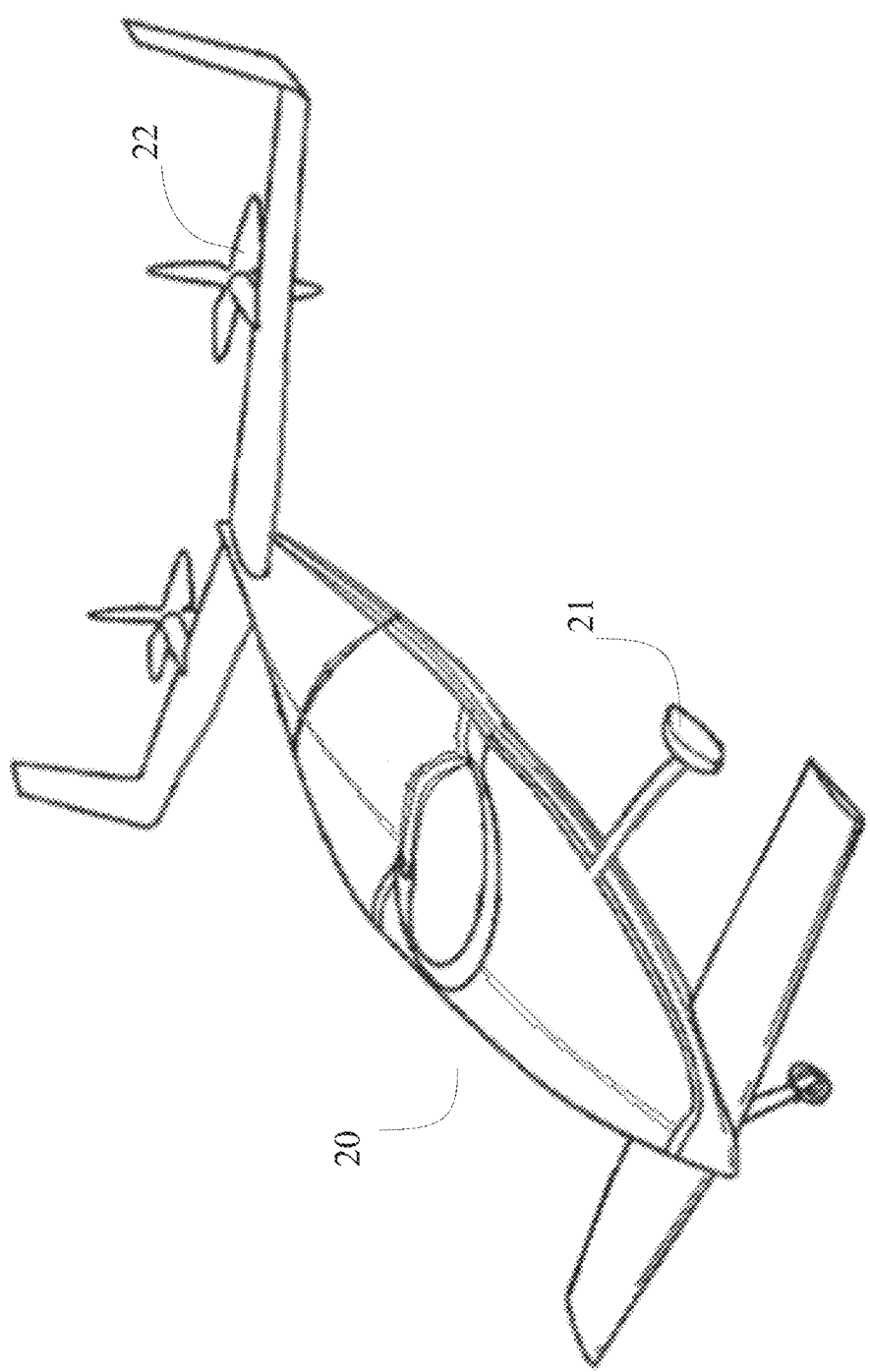
FIG. 2 is a schematic diagram of another application scenario of a detection circuit of clock anomaly and method, a clock circuit, a chip, and a radar according to some embodiments of this application.

FIG. 2 is a schematic diagram of another application scenario of a detection circuit of clock anomaly and method, a clock circuit, a chip, and a radar according to some embodiments of this application.

An aircraft 20 shown in FIG. 2 may be an aircraft with an assisted driving function and an autonomous driving function. The aircraft 20 may include a sensing system 21 and a power mechanism 22.

Herein, the sensing system 21 may include one or more sensors to sense at least one of an ambient obstacle, spatial azimuth, speed, acceleration, or the like of the aircraft 20. Types of sensors include, but are not limited to, ranging sensors, position sensors, motion sensors, inertial sensors, or image sensors. Sensing data provided by the sensing system 21 can be used to control the spatial azimuth, the speed and/or the acceleration of the aircraft 20. The sensing system 21 is used to collect related information of the aircraft 20. Different types of sensors may sense different types of signals or sense signals originated from different sources. For example, the sensor includes the radar, the inertial sensor, a GPS sensor, a vision or image sensor (such as the camera), or the like.

The detection circuit of clock anomaly and method and the clock circuit in the embodiments of this application can be applied to any one or more types of electronic devices using a clock, for example, the LiDAR 11, the millimeter-wave radar, the positioning device 12, the ECU, the sensing system 21, or a communication system shown in FIG. 1 or FIG. 2.

In the foregoing application scenarios such as assisted driving, autonomous driving, and smart transportation, it is crucial to quickly and accurately sense an ambient environment of the mobile device.

Herein, the autonomous driving scenario of the vehicle is used as an example for illustration. Based on vehicle position information, obstacle information, road information, and the like sensed by the sensing system, road signal control is scheduled to improve management quality and efficiency of a road. Based on the information sensed by the sensing system, a decision can be made for the corresponding autonomous vehicle, and a safety distance between autonomous vehicles can be adjusted, so that the vehicle can drive safely and reliably on the road.

As one of the most important sensors for autonomous driving, the LiDAR can provide a decision-making system with critical information such as position, size, and motion information of a traffic participant in fields such as smart transportation, assisted driving and autonomous driving. The LiDAR is equivalent to human eyes for the autonomous vehicle. How to protect safety of data collection and transmission of the LiDAR is extremely important, and directly matters to personal safety and property safety of a passenger and a driver in the vehicle, and even their lives.

A main control chip of the LiDAR is a core component of the LiDAR. The main control chip is responsible for collection, processing, and transmission of at least part of LiDAR information. A clock of the main control chip is responsible for providing a related functional circuit with a clock source required for operation, and lays a basis for implementing a function of a related digital circuit. Stability of the clock signal is crucial for the LiDAR and a device that needs to use LiDAR data.

However, the applicant has found that the clock generating unit may physically fail due to a manufacturing defect, an aging factor, or the like. For example, the clock generating unit may generate an unqualified clock signal after aging. For example, the clock generating unit generates a clock glitch signal or has an inaccurate frequency.

In addition, when being controlled and hacked by a hacker, the clock generating unit may also cause the main control chip to fail at its origin.

For example, for the main control chip of the LiDAR, the hacker can control a clock of the chip to enable a clock frequency of the chip to exceed the highest frequency of the chip. This can lead to instability and an anomaly of the chip. In addition, if the clock of the control chip is unstable when the main control chip is hopping or running under a key command, a chip security system crashes.

Figure 3:
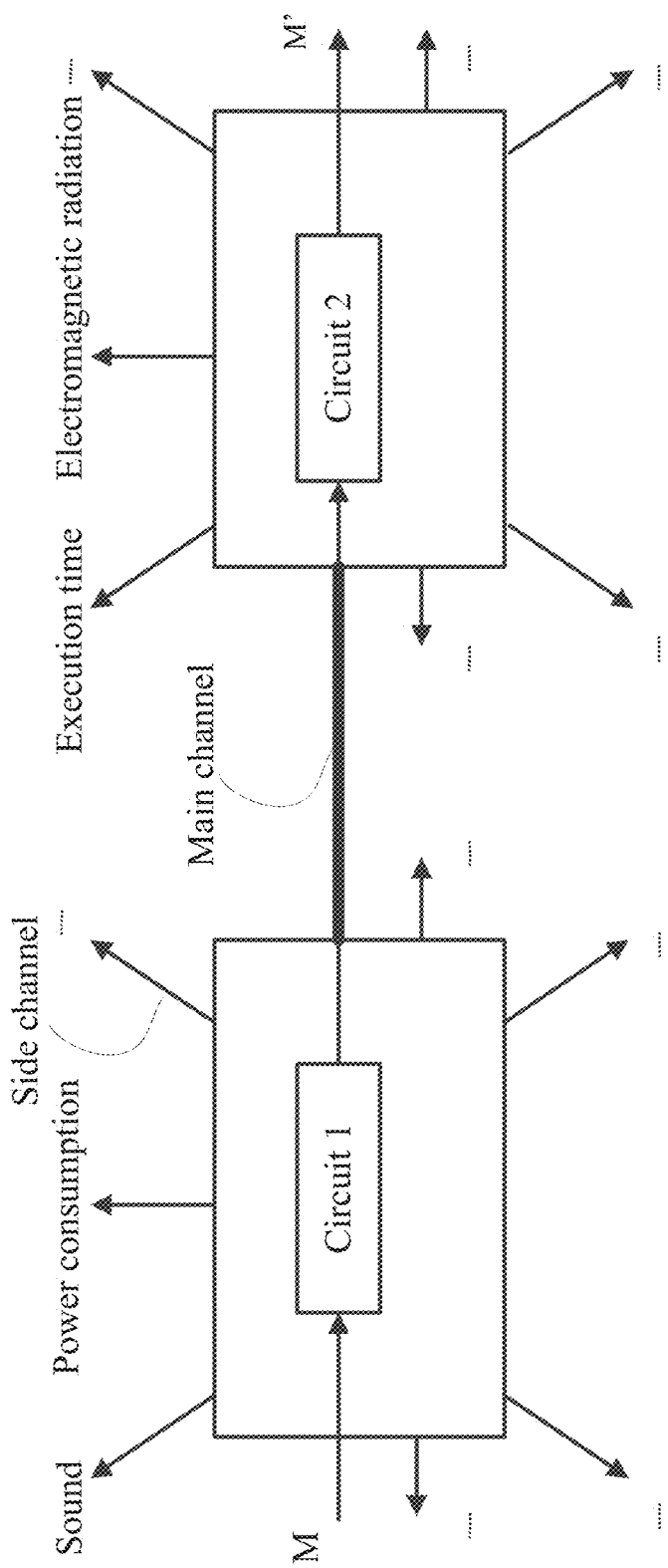
FIG. 3 is a block diagram of a detection circuit of clock anomaly according to some embodiments of this application.

For example, the hacker can slow down the operation of the chip by reducing the clock frequency of the chip, thereby greatly reducing difficulty of analyzing side-channel information and rendering it easier to analyze the operation of the main control chip. FIG. 3 is a schematic diagram of a side-channel attack according to some embodiments of this application.

Referring to FIG. 3, a signal can be transmitted between a circuit 1 and a circuit 2 through a main channel. In the related art, studies are mainly conducted on how to prevent signals from being stolen or damaged when being transmitted over the main channel. However, when the circuit processes a signal (M) and outputs a signal (M'), information leaked through the side channel may indirectly indicate the signal processed or the signal transmitted by the circuit. For example, a side-channel attack can target a type of cryptographic integrated circuits with limited resources.

For example, a signal may be stolen from a security chip via a side-channel analysis technology of the security chip. Key-related information may be leaked through power consumption, sound information, electromagnetic radiation, transmission time, execution time, or other detectable information. If no measures are taken to protect the integrated circuit, it may only take little efforts to crack the integrated circuit and obtain the key. A side-channel analysis attack method has become a possible "shortcut" to crack a cryptographic chip, and therefore, has attracted increasing attention from academia and industry.

In conclusion, the clock circuit may physically generate an unqualified clock due to interference or device aging factor. In the technical field of the LiDAR, there is a lack of a hardware monitoring solution or a defense policy for the clock generating module, or the hardware monitoring solution or the defense policy can only be implemented via a relatively complex analog circuit. There is a lack of a defense and monitoring solution targeting underlying hardware of the chip in the related art, and therefore, a defense policy against a clock frequency attack needs to be further improved.

In view of the foregoing reasons, this application aims to provide a technical solution that can conveniently implement functions such as monitoring and anomaly handling for the clock generating unit at a lower cost.

For example, in some embodiments, for the clock signal output by the clock generating unit, whether the clock signal is abnormal is determined by determining a number of pulses of the clock signal within a specific time period.

For example, in some embodiments, a timestamp in a received packet can also be used as a time reference period. For a clock signal with a specific clock frequency, a number of pulses that should exist in a time period of the clock signal between two timestamps can be determined. Therefore, anomaly detection can be performed on the clock signal based on the number of pulses described above.

The clock anomaly detection is performed on the clock signal from at least one of the foregoing perspectives, which can effectively ensure the reliability of the clock signal output by the clock generating unit, to better implement safe operation of the LiDAR and further improve the personal safety and the property safety of the user.

In addition, in some embodiments, an interrupt signal or a reset signal may also be sent after an anomaly of the clock generating unit is detected, so that the system protects and maintains the clock generating unit.

Figure 4:
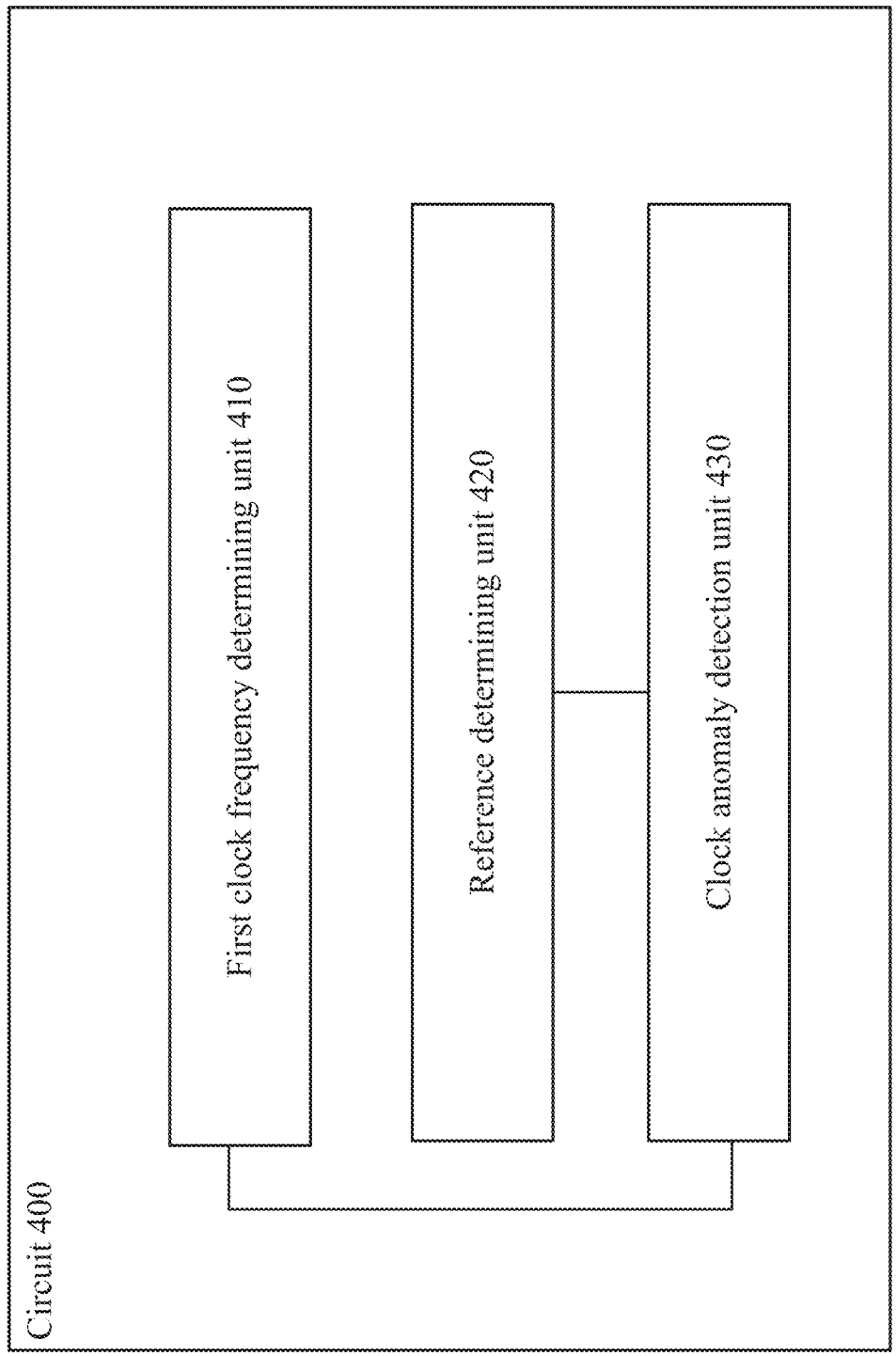
FIG. 4 is a schematic diagram of a side-channel attack according to some embodiments of this application.

FIG. 4 is a block diagram of a detection circuit of clock anomaly according to some embodiments of this application.

Referring to FIG. 4, a detection circuit of clock anomaly 400 may include: a first clock frequency determining unit 410, a reference determining unit 420, and a clock anomaly detection unit 430.

The first clock frequency determining unit 410 is configured to determine a first clock frequency of a received first clock signal. Herein, the first clock signal may be a signal generated by a clock generating unit. The first clock signal is used to cyclically correct and synchronize clocks of all circuits (or all nodes in a network) in the system via a synchronization signal, so that the circuits can be accurately synchronized.

The reference determining unit 420 is configured to determine a reference corresponding to the first clock signal, where the reference is determined based on a second clock signal and/or a timestamp. For example, the reference can be a specific clock frequency or pulse count, or the like.

The clock anomaly detection unit 430 is connected to the first clock frequency determining unit and the reference determining unit separately and configured to perform anomaly detection on the first clock signal based on the first clock frequency and the reference. For example, it is determined whether the first clock signal is normal by comparing the first clock frequency with the reference. For example, it is determined whether the first clock signal is normal by determining a difference between the first clock frequency and the reference. For example, it is determined whether the first clock signal is normal by performing a logical operation on the first clock frequency and the reference. For example, it is determined whether the first clock signal is normal by performing a logical operation on the first clock frequency and the reference and then comparing a calculated result with a threshold.

Figure 5:
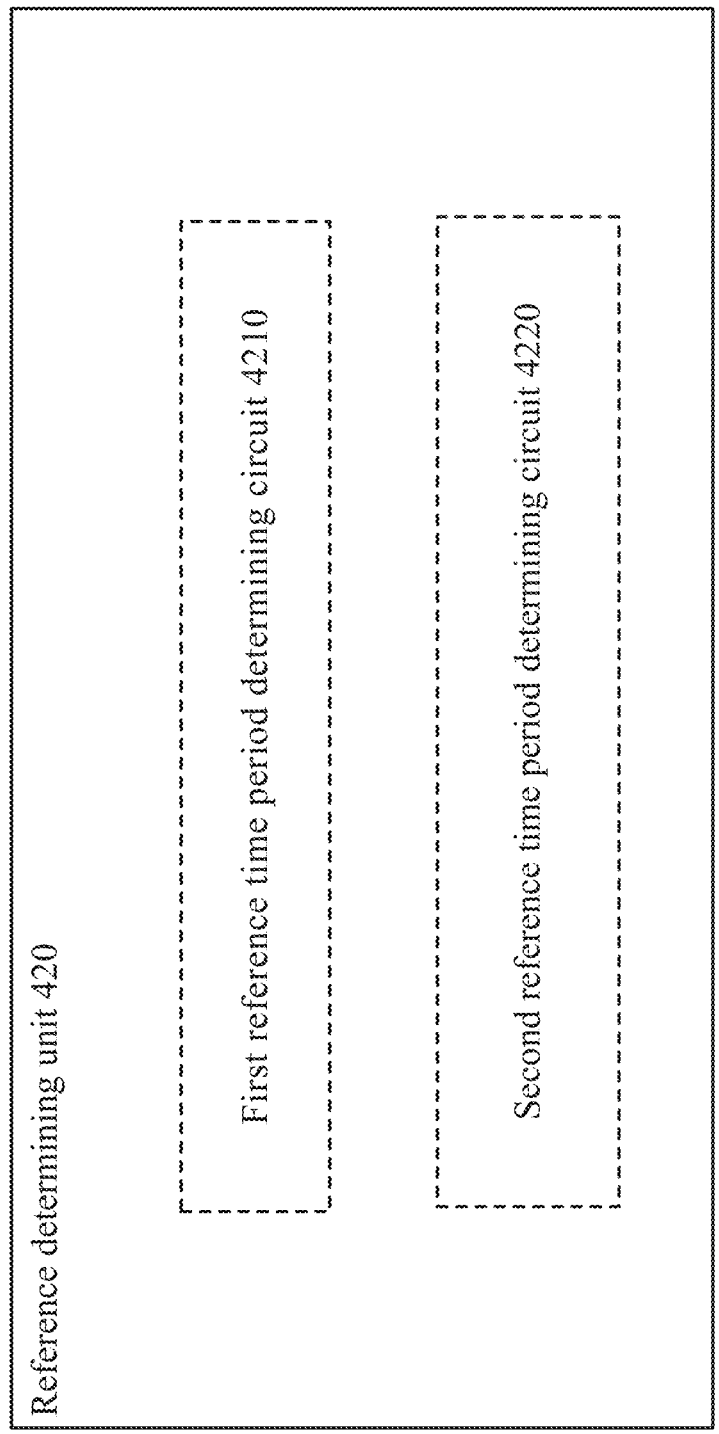
FIG. 5 is a block diagram of a reference determining unit according to some embodiments of this application.

FIG. 5 is a block diagram of a reference determining unit according to some embodiments of this application.

Referring to FIG. 5, the reference determining unit 420 includes a first reference time period determining circuit 4210 and/or a second reference time period determining circuit 4220.

In some embodiments, the first reference time period determining circuit 4210 is configured to determine a first reference time period, where the first reference time period is a time period during which a number of pulses specific to the second clock signal reaches a first count value within the first reference time period. The first reference time period may be a time period with specific time length, or a time period with random time length. For example, in order to improve accuracy of the first reference time period, the pulses of the second clock signal may be counted, and when the count reaches a preset value, the first reference time period is considered to expire. For example, in order to increase randomness of a detection, a random number may be determined, and the pulses of the second clock signal are counted, and when the count reaches the random number, the first reference time period is considered to expire.

It should be noted that, in order to detect the first clock signal based on the same standard as the reference, the foregoing first clock frequency may be determined based on the foregoing first reference time period. For example, the pulses of the first clock signal are counted in the first reference time period, a count that can represent the first clock frequency can be obtained, to compare the count with the count corresponding to the second clock signal.

Figure 6:
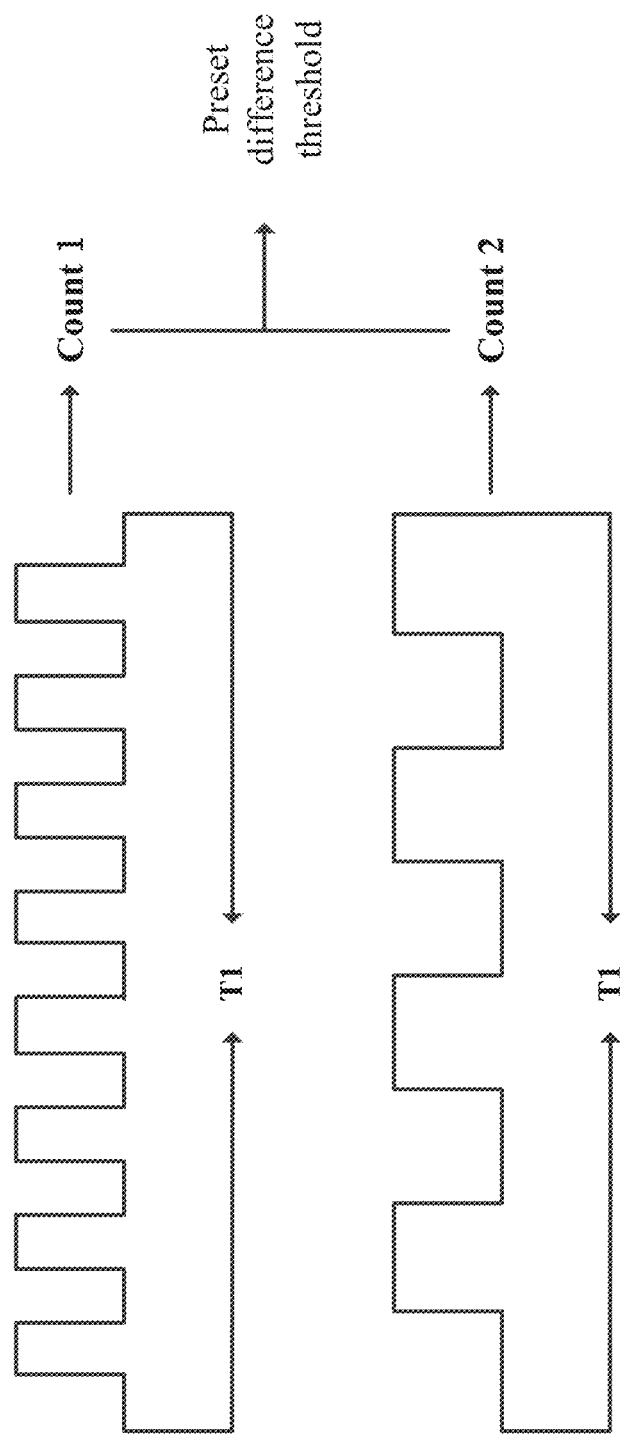
FIG. 6 is a schematic diagram of a process of determining a reference time period according to some embodiments of this application.

FIG. 6 is a schematic diagram of a process of determining a reference time period according to some embodiments of this application.

Referring to FIG. 6, an upper part of FIG. 6 represents the first clock signal, and a lower part represents the second clock signal. In the same first reference time period T1, the number of pulses included in the first clock signal is count 1, and the number of pulses included in the second clock signal is count 2, and respective clock frequencies of the first clock signal and the second clock signal may be the same or different. If the respective clock frequencies of the first clock signal and the second clock signal are the same, it can be checked whether a difference between count 1 and count 2 is within an error range. If the respective clock frequencies of the first clock signal and the second clock signal are different, it can be checked whether the difference between count 1 and count 2 is within an error range of a preset difference threshold (for example, preset difference threshold±error).

In some embodiments, the second reference time period determining circuit 4220 is configured to determine a second reference time period, where the second reference time period is a time period between respective timestamps of two packets.

Figure 7:
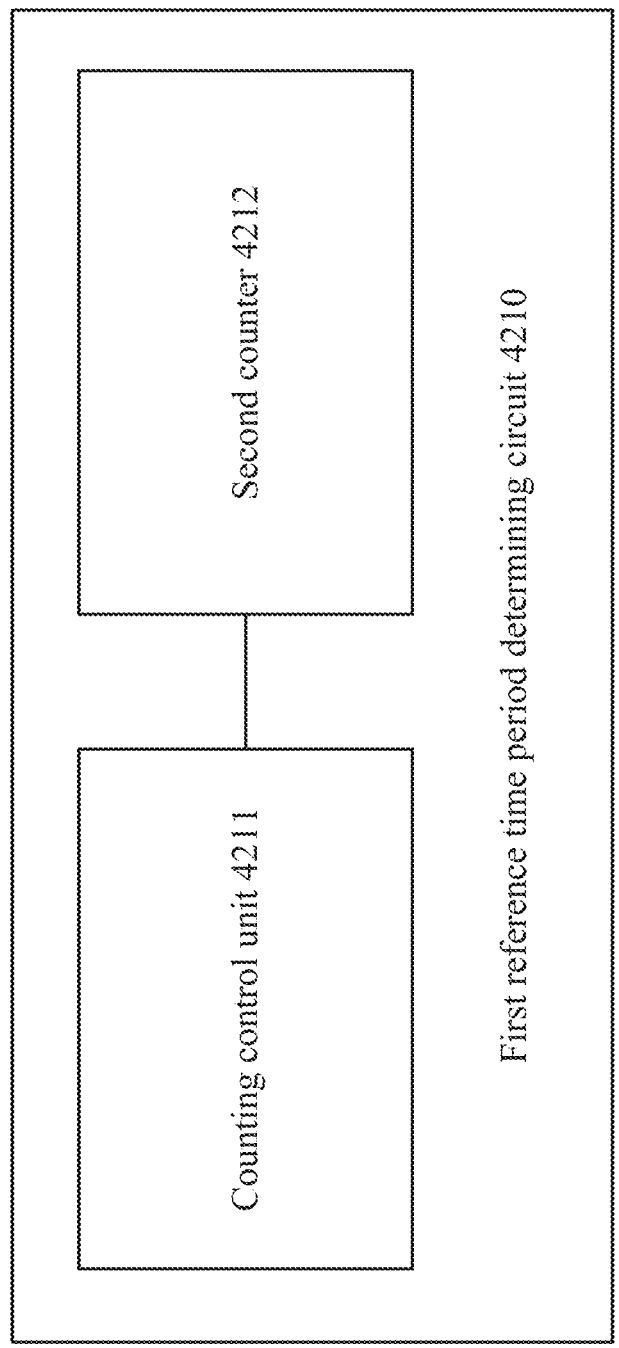
FIG. 7 is a block diagram of a first reference time period determining circuit according to some embodiments of this application.

FIG. 7 is a block diagram of a first reference time period determining circuit according to some embodiments of this application.

Referring to FIG. 7, in some embodiments, the first reference time period determining circuit 4210 may include a counting control unit 4211 and a second counter 4212.

For example, the second counter 4212 is connected to a clock anomaly detection unit and configured to: count a pulse of a second clock signal in response to a first enabling signal until a preset first count value is reached, transmit a first count value to the clock anomaly detection unit, and output a counting completion signal. Herein, the first enabling signal may be a high-level signal or a low-level signal, for example, a high-level pulse signal or a continuous high-level signal.

The counting control unit 4211 is connected to the foregoing first counter and the second counter 4212 separately and configured to: output the first enabling signal to the first counter and the second counter, output a counting ending instruction to the first counter in response to the counting completion signal, and send a second enabling signal to the clock anomaly detection unit, so that the clock anomaly detection unit performs anomaly detection on the first clock signal based on the first count value and the second count value. The counting ending instruction may be characterized by a high-level signal and/or a low-level signal. For example, the second counter outputs a counting completion identifier to the counting control unit 4211. The second enabling signal may be a high-level signal or a low-level signal, for example, a high-level pulse signal or a continuous high-level signal.

The first counter and the second counter each can record the number of pulses. The counter has a basic counting unit and some control gates. The counting unit can have a series of various flip-flops with an information storage function. It should be noted that each of the foregoing first counter and second counter may be implemented by hardware separately. The first counter and the second counter may be implemented by software separately. Each of the first counter and the second counter may be implemented by a combination of software and hardware.

Using an addition counter as an example, the flip-flop can be used to form a binary addition counter. In some embodiments, for a 3-bit binary asynchronous adder having 3 falling-edge triggered flip-flops T, an output signal of the flip-flops T is controlled by a pulse signal, and the counter starts counting from a state in which Q2, Q1, and Q0 are 000.

Triggered by a falling edge of a count input pulse CP, output Q0 of a flip-flop FF0 is flipped. 0 becomes 1 or 1 becomes 0. Because CP1 is extracted from Q0, when triggered by a falling edge of Q0, output Q1 of a flip-flop FF1 is flipped. Similarly, because CP2=Q1, when triggered by the falling edge of Q1, output Q2 of a flip-flop FF2 is flipped. If a rising-edge triggered flip-flop T' is used, an asynchronous binary addition counter can also be formed, but a carry pulse of each stage of flip-flop should be switched to a terminal $Q^-$ for outputting. This is because when an output terminal Q of a low-bit flip-flop changes from 1 to 0, a rising edge of the terminal $Q^-$ can just be used as a high-bit trigger pulse.

Using a subtraction counter as an example, if the flip-flops T' are connected according to a binary subtraction rule, a binary subtraction counter can be obtained. Based on a binary subtraction counting rule, if the low-bit flip-flop is already 0, the low-bit flip-flop should be flipped to 1 after a subtraction counting pulse is input, and at the same time, a borrow signal is sent to a high bit, so that the high bit is flipped.

Using software counting as an example, an operation n & (n−1) can be repeatedly performed until n becomes 0. Herein, a function of the operation n & (n−1) is to remove the last 1 from n, that is, the last 1 in n becomes 0. For example, if n=11111, a calculation process is as follows: n=11110, and a count is 1; if n=11100, a count is 2; if n=1000, a count is 3; if n=10000, a count is 4; or if n=00000, a count is 5.

Figure 8:
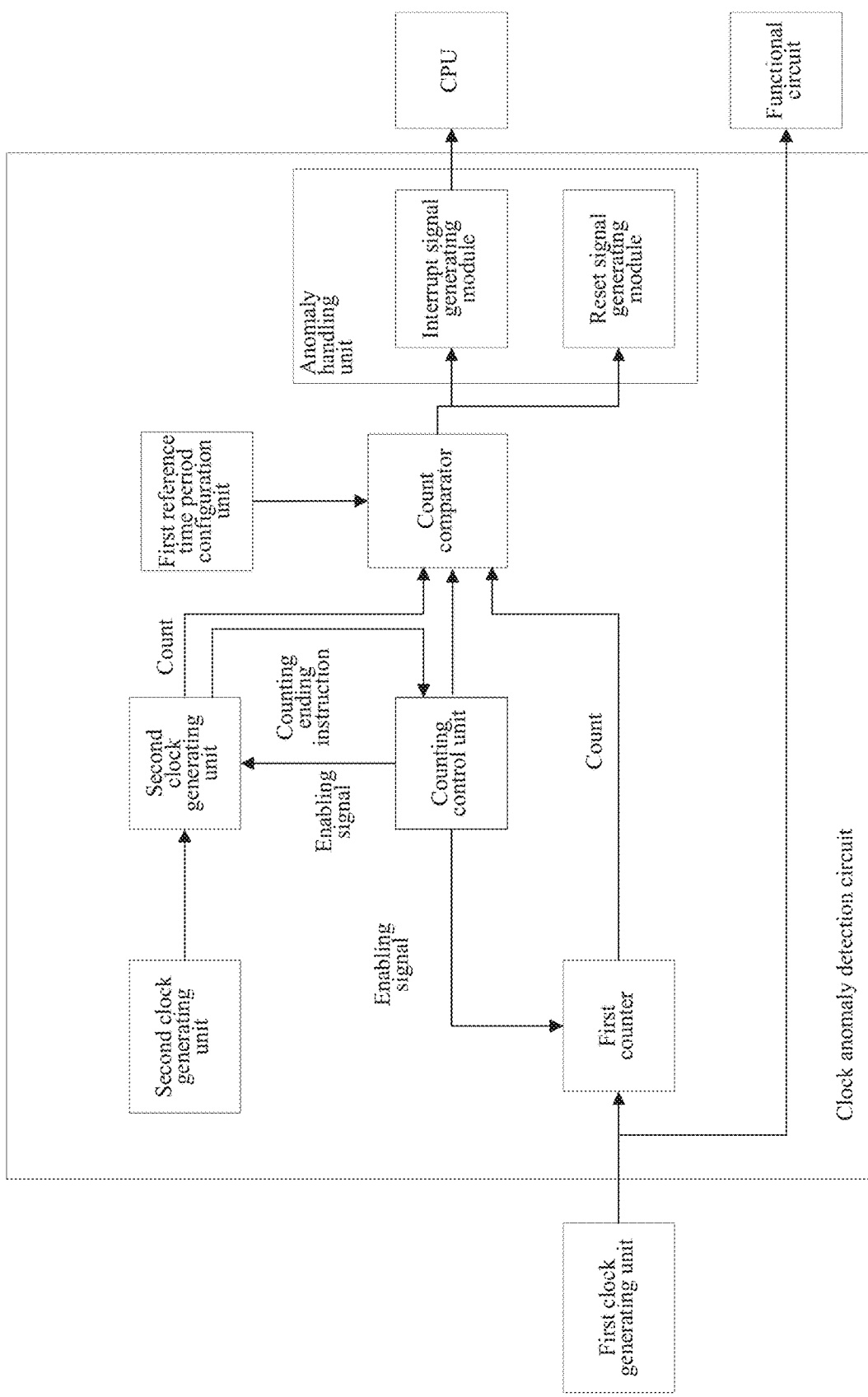
FIG. 8 is a block diagram of another clock detection circuit according to some embodiments of this application.

In some embodiments, the foregoing circuit may further include an anomaly handling unit. FIG. 8 is a block diagram of another clock detection circuit according to some embodiments of this application.

Referring to FIG. 8, the anomaly handling unit may include at least one of an interrupt signal generating module or a reset signal generating module.

Herein, the interrupt signal generating module is configured to output an interrupt signal when the first clock signal is abnormal. The reset signal generating module is configured to output a reset signal when the first clock signal is abnormal.

For example, the reset signal is a signal output when the clock is abnormal for short time (for example, one or several cycles), and is used to improve quality of the clock via reset and restart. For example, the clock generating circuit outputs an abnormal clock in a short time period due to factors such as external interference. In order to improve quality of the clock signal, the reset signal generating module can output a reset signal to a functional circuit such as a central processing unit (CPU).

For example, an interrupt signal is a signal output when quality of the clock continues to be low for long time (for example, exceeding a specific count or times), and is used for clock anomaly handling. For example, when the clock signal is still in an abnormal state after reset processing is performed based on the reset signal, in order to improve the personal safety and the property safety of the user, the interrupt signal generating module can output an interrupt signal to a control unit such as the central processing unit (CPU) to control the clock generating unit to stop outputting the clock signal, or switch to a standby clock signal, or the like.

The following provides an exemplary description of anomaly detection based on a reference time period.

Figure 9:
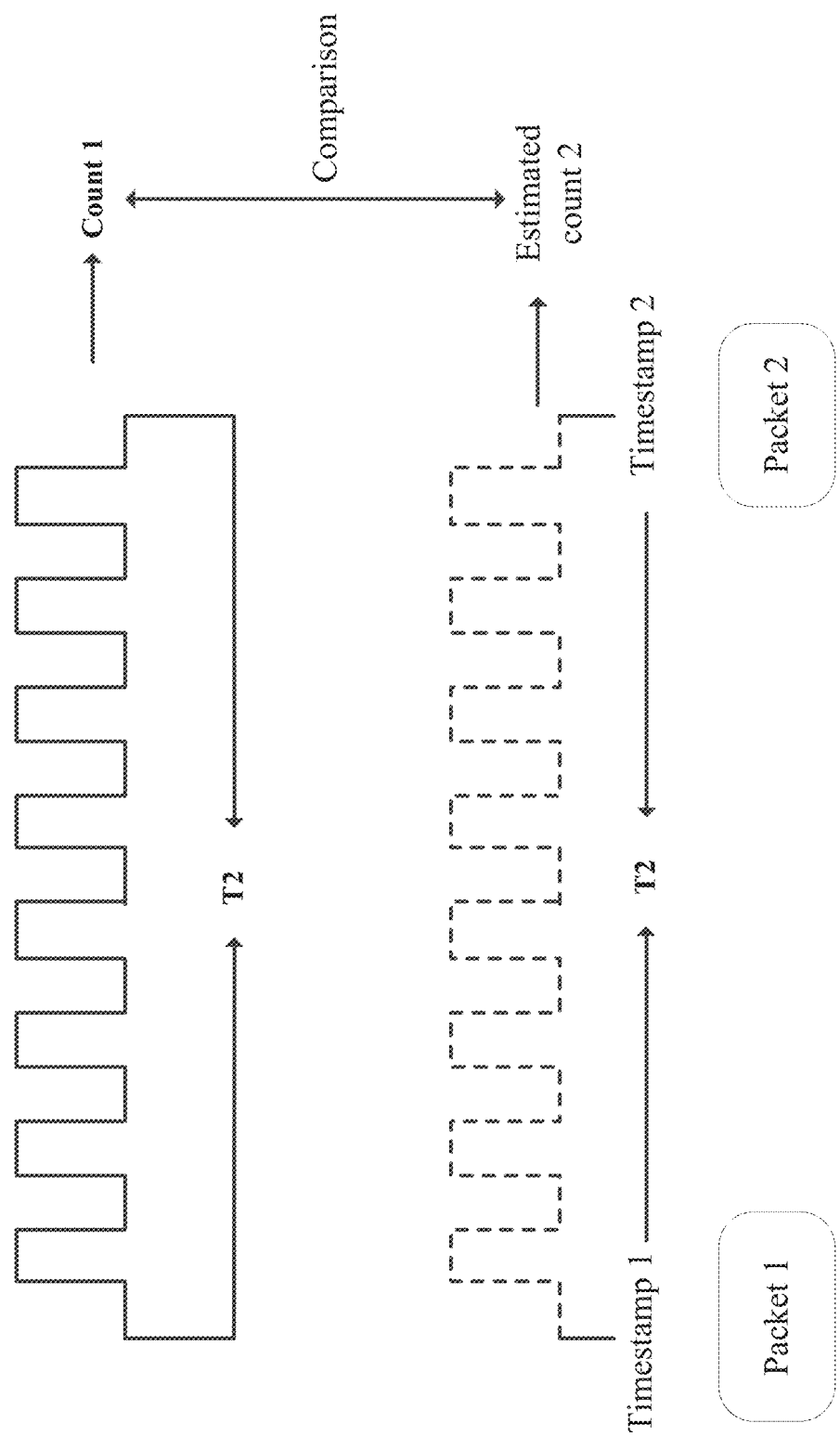
FIG. 9 is a schematic diagram of another process of determining a reference time period according to some embodiments of this application.

FIG. 9 is a schematic diagram of another process of determining a reference time period according to some embodiments of this application.

Referring to FIG. 9, an upper part of FIG. 9 represents the first clock signal. A second time period T2 is determined based on timestamps included in each of two packets, for example, second time period T2=timestamp 2−timestamp 1. Because the ideal clock frequency of the first clock signal is stable and known (such as a preset value or a fixed value), an estimated count 2 of pulses that should be included in the second time period T2 can be calculated based on the clock frequency. In addition, the number of pulses included in the first clock signal in the second time period T2 may be further determined to be count 1 in a manner of counting. In this way, it can be checked whether a difference between count 1 and the estimated count 2 is within an error range.

In order to conveniently determine the clock frequency of the first clock signal, the clock frequency may be determined by counting via a counter. In some embodiments, the first clock frequency determining unit includes a first counter, connected to the clock anomaly detection unit and configured to: count a pulse of the first clock signal within the first reference time period to obtain a second count, and transmit the second count value to the clock anomaly detection unit.

Figure 10:
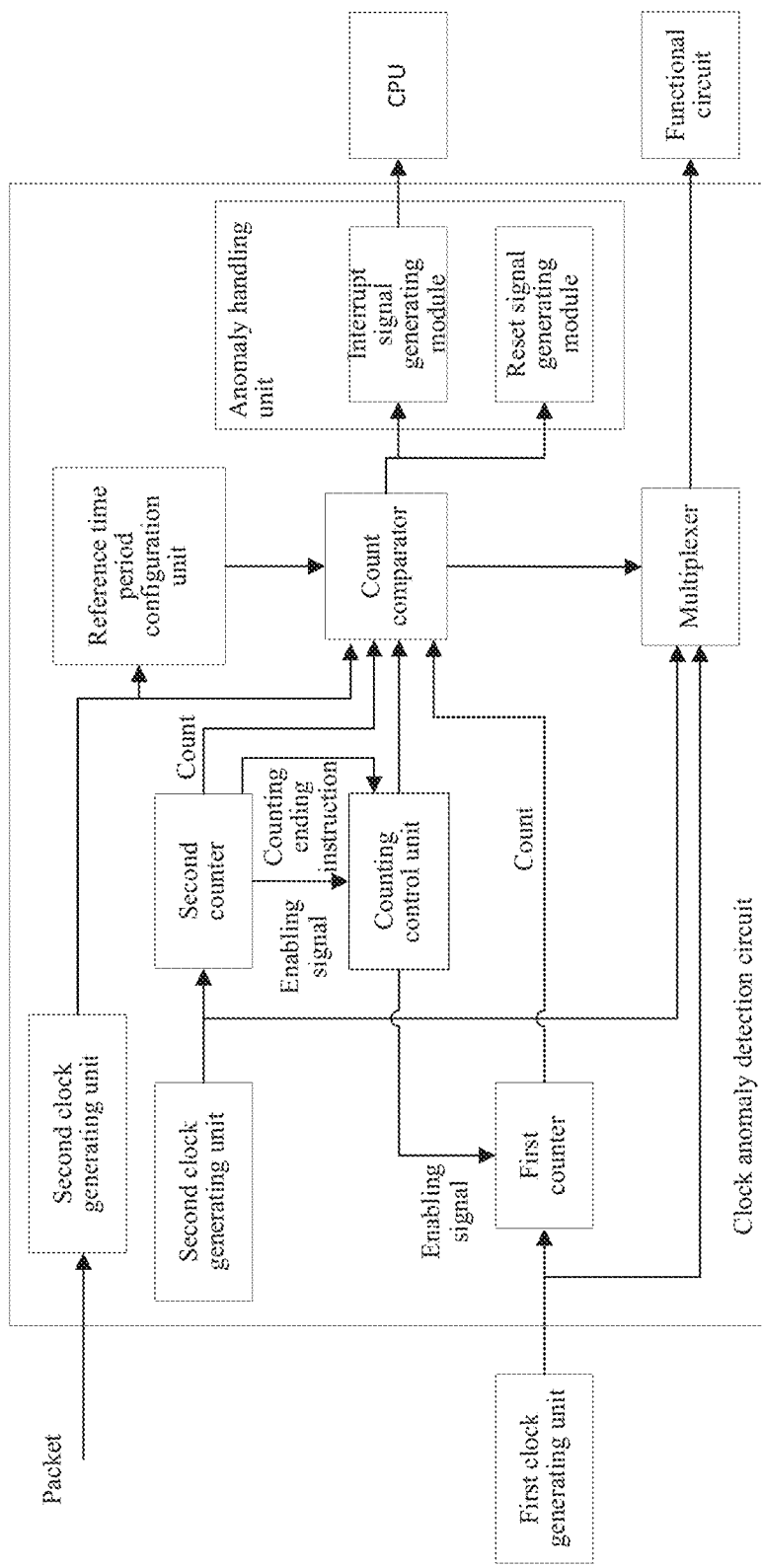
FIG. 10 is a block diagram of another clock detection circuit according to some embodiments of this application.

FIG. 10 is a block diagram of another clock detection circuit according to some embodiments of this application. It should be noted that when anomaly detection is performed based on the reference time period, the second clock generating unit, the second counter, the counting control unit, and their connections in FIG. 10 can be ignored or omitted.

Referring to both FIG. 9 and FIG. 10, the reference time period can be length of a time period between two captured packets, and based on the number of pulses included in the first clock signal within the length of the time period, it can be determined whether a proper scope is satisfied. In some embodiments, for the first clock signal with a specific clock frequency, the number of pulses included in the time period with specific length should be within a fixed number interval. For example, for a clock signal with a clock frequency of 2.0 gigahertz (GHz), when length of a time period is 1 second (S), the clock signal having 2 billion pulses (signals), and a period of each clock signal is 0.5 nanoseconds. Therefore, pulses included in a to-be-detected first clock signal within 1 second can be counted, and if a difference between a count result and 2 billion is within an error range, it can be roughly determined that the first clock signal is in a normal state.

In some embodiments, the clock anomaly detection unit includes a first count comparator, where the first count comparator is configured to compare a count difference with a first preset difference threshold, and/or compare the count difference with a second preset difference threshold to perform anomaly detection on the first clock signal, where the count difference is a difference between the first count value and the second count value, and the first preset difference threshold is different from the second preset difference threshold.

For ease of understanding, a comparator with 1-bit parallel value is described.

Assuming that two one-bit binary digits are Ai and Bi respectively, comparison results are: LA>B, LA<B, and LA=B. A truth table for comparing one-bit values is Table 1.

TABLE 1

| Comparison input | | Comparison result output | | |
|---|---|---|---|---|
| $A_i$ | $B_i$ | $L_{A>B}$ | $L_{A<B}$ | $L_{A=B}$ |
| 0 | 0 | 0 | 0 | 1 |
| 0 | 1 | 0 | 1 | 0 |
| 1 | 0 | 1 | 0 | 0 |
| 1 | 1 | 0 | 0 | 1 |

Three output functions of the 1-bit parallel comparator can be a formula (1) to a formula (3).

$$L_{A>B} = A_i \overline{B}_i \qquad \text{formula(1)}$$

$$L_{A<B} = \overline{A}_i B_i \qquad \text{formula (2)}$$

$$L_{A=B} = \overline{A}_i \overline{B}_i + A_i B_i \qquad \text{formula (3)}$$

Based on the foregoing three output functions, a comparator circuit can be designed.

Figure 11:
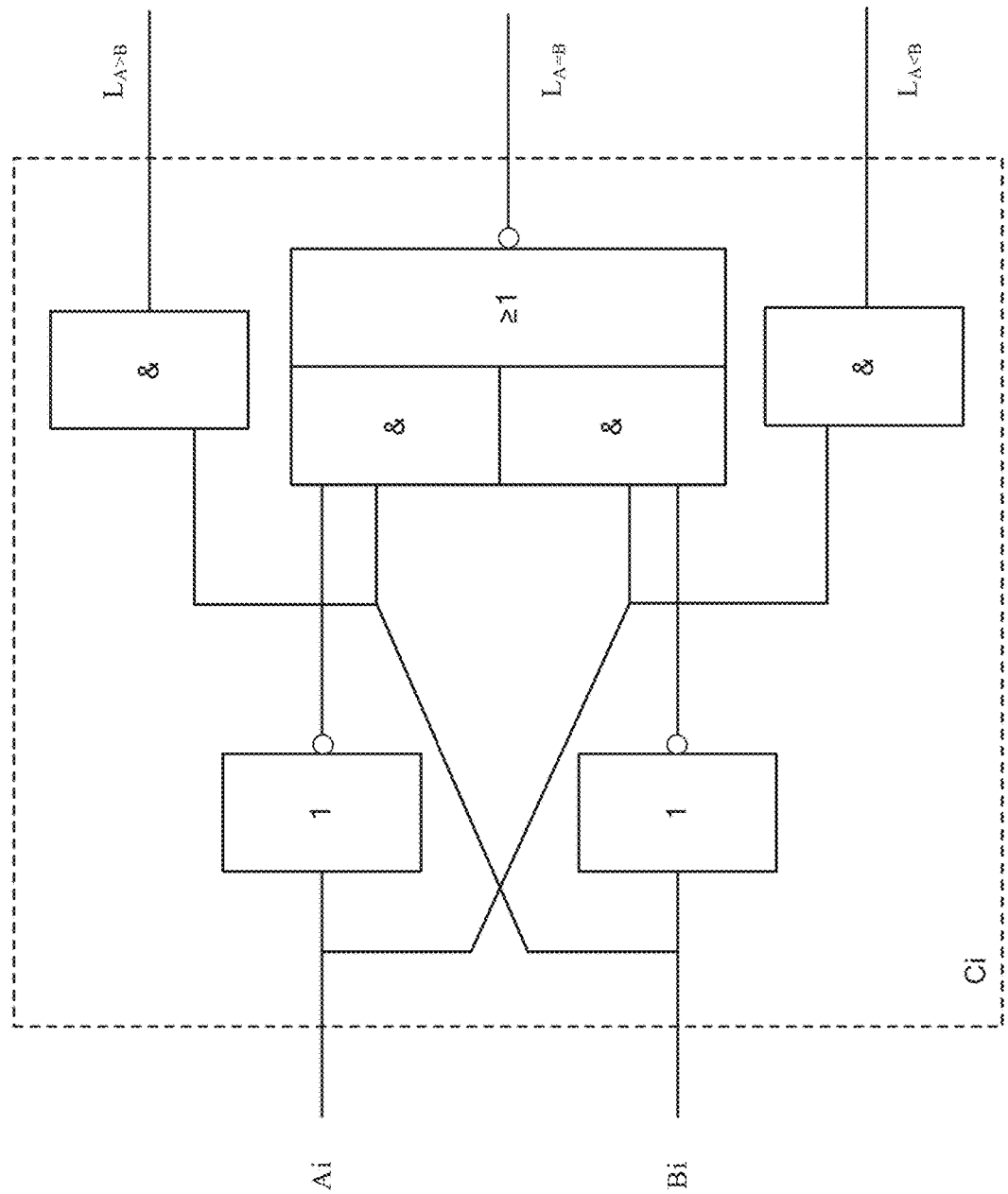
FIG. 11 is a circuit diagram of a comparison logic circuit for unit data according to some embodiments of this application.

Referring to FIG. 11, Ci represents a comparator circuit that may include a combination of multiple logical operation circuits. For example, "1" in FIG. 11 can be represented by a high level. "&" means bitwise "AND", and a bitwise operation process includes: converting a character into a binary digit for representation, and then performing a bitwise operation.

For a comparator with a multi-bit value, a comparison principle of high-bit priority can be used. For example, for two comparators A and B with four-bit values, $A = A_4 A_3 A_2 A_1$, $B = B_4 B_3 B_2 B_1$, and if $A_4 > B_4$, $A > B$. If $A_4 < B_4$, $A < B$. When high bits are equal, second high bits are compared according to the same principle, and so on until the lowest bits are compared.

Besides, in addition to comparison of the current four bits, when the current four bits are equal, comparison result input of lower bits can also be compared, to compare more bits. As shown in Table 2, in order to implement the foregoing functions, some embodiments also provide a truth table for comparing four-bit values.

TABLE 2

| Current four-bit input | | | | Lower four-bit result input | | | Comparison result output | | |
|---|---|---|---|---|---|---|---|---|---|
| $A_4, B_4$ | $A_3, B_3$ | $A_2, B_2$ | $A_1, B_1$ | $I_{A>B}$ | $I_{A=B}$ | $I_{A<B}$ | $L_{A>B}$ | $L_{A=B}$ | $L_{A<B}$ |
| $G_4$ | x | x | x | x | x | x | 1 | 0 | 0 |
| $L_4$ | x | x | x | x | x | x | 0 | 0 | 1 |
| $E_4$ | $G_3$ | x | x | x | x | x | 1 | 0 | 0 |
| $E_4$ | $L_3$ | x | x | x | x | x | 0 | 0 | 1 |
| $E_4$ | $E_3$ | $G_2$ | x | x | x | x | 1 | 0 | 0 |
| $E_4$ | $E_3$ | $L_2$ | x | x | x | x | 0 | 0 | 1 |
| $E_4$ | $E_3$ | $E_2$ | $G_1$ | x | x | x | 1 | 0 | 0 |
| $E_4$ | $E_3$ | $E_2$ | $L_1$ | x | x | x | 0 | 0 | 1 |
| $E_4$ | $E_3$ | $E_2$ | $E_1$ | 1 | 0 | 0 | 1 | 0 | 0 |
| $E_4$ | $E_3$ | $E_2$ | $E_1$ | 0 | 1 | 0 | 0 | 1 | 0 |
| $E_4$ | $E_3$ | $E_2$ | $E_1$ | 0 | 0 | 1 | 0 | 0 | 1 |

Based on Table 2, output functions shown in formula (4) to formula (6) can be obtained. In Table 2, x means that no calculation is required. $G_4$ means that a value of a fourth bit of a value A is greater than a value of a fourth bit of a value B, and meanings of $G_3$, $G_2$ and $G_1$ are deduced by analogy. $L_4$ means that a value of a fourth bit of the value A is less than a value of a fourth bit of a value B, and meanings of $L_3$, $L_2$ and $L_1$ are deduced by analogy. $E_4$ means that a value of a fourth bit of the value A is equal to a value of a fourth bit of the value B, and meanings of $E_3$, $E_2$ and $E_1$ are deduced by analogy.

$$L_{A>B} = G_4 + E_4 G_3 + E_4 E_3 G_2 + E_4 E_3 E_2 G_1 + E_4 E_3 E_2 E_1 I_{A>B} \quad \text{formula (4)}$$

$$L_{A<B} = L_4 + E_4 L_3 + E_4 E_3 L_2 + E_4 E_3 E_2 L_1 + E_4 E_3 E_2 E_1 I_{A<B} \quad \text{formula (5)}$$

$$L_{A=B} = E_4 E_3 E_2 E_1 I_{A=B} \quad \text{formula (6)}$$

Herein, $I_{A>B}$ means that lower four-bit values of data A are greater than lower four-bit values of data B, $I_{A<B}$ means that the lower four-bit values of the data A are less than the lower four-bit values of the data B, and $I_{A=B}$ means that the lower four-bit values of the data A are equal to the lower four-bit values of the data B.

Figure 12:
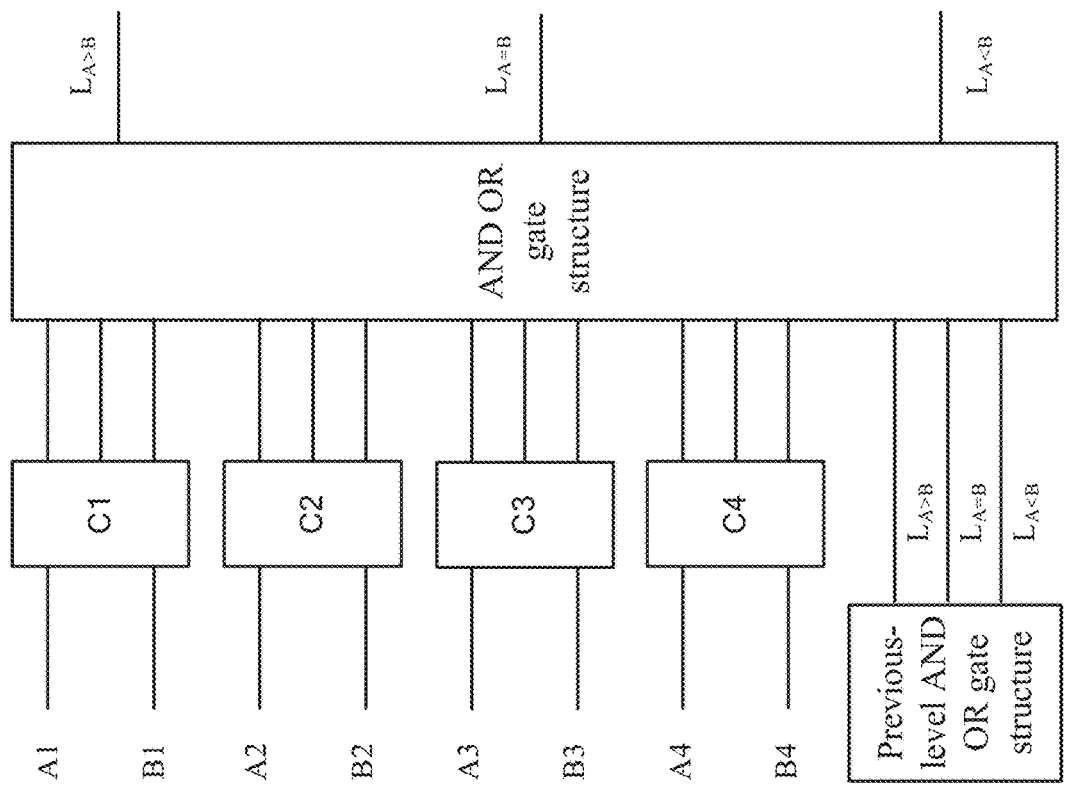
FIG. 12 is a circuit diagram of a comparison logic circuit of eight-bit data according to some embodiments of this application.

For a circuit diagram of a multi-bit value comparator, refer to FIG. 12. Herein, C1 to C4 each represent a combination of multiple logical operation circuits. For example, a logical operation circuit denoted as $C_i$ in FIG. 11 may be used.

It should be noted that the combination of logical operation circuits shown in FIG. 11 and FIG. 12 is only an example, which is not limited herein. It should be noted that logical operations include, but are not limited to, "OR", "AND", "NOT", "OR NOT", "AND NOT", and "Exclusive OR". Logical operation circuits include, but are not limited to, an "OR operation circuit", an "AND operation circuit", a "NOT operation circuit", an "OR NOT operation circuit", an "AND NOT operation circuit", and an "Exclusive OR operation circuit". These logical operation circuits may also be referred to as logical operation units. A magnitude relationship between two values can be compared by using a combination of various logical operation circuits or correspondingly, a combination of various logical operation circuits, which is not limited herein.

Using comparison between values through software as an example, comparison functions of a database include, but are not limited to, functions shown below. BETWEEN AND: Used to determine whether a value is between two limits (including the limits), where output results are that the value is not between the two limits (NOT) and that the value is between the two limits (BETWEEN). IN (x1, x2, x3 . . . ): Used to determine whether an input value is equal to one of a value list, where an output result may be that the input value is not in the list (NOT) or that the input value is in the list (IN). CASE WHEN: Used to output a specific result under a specific condition.

In some embodiments, the counting control unit includes a delay control circuit. For example, the first clock signal is not monitored all the time (for example, in consideration of impact of power consumption, heat dissipation, and the like), and after a round of monitoring is completed, for example, after monitoring of the first clock signal is completed based on the first reference time period and/or the second reference time period, the monitoring process may be delayed for specific duration before an enabling signal is sent to a counter to start the next round of monitoring.

Figure 13:
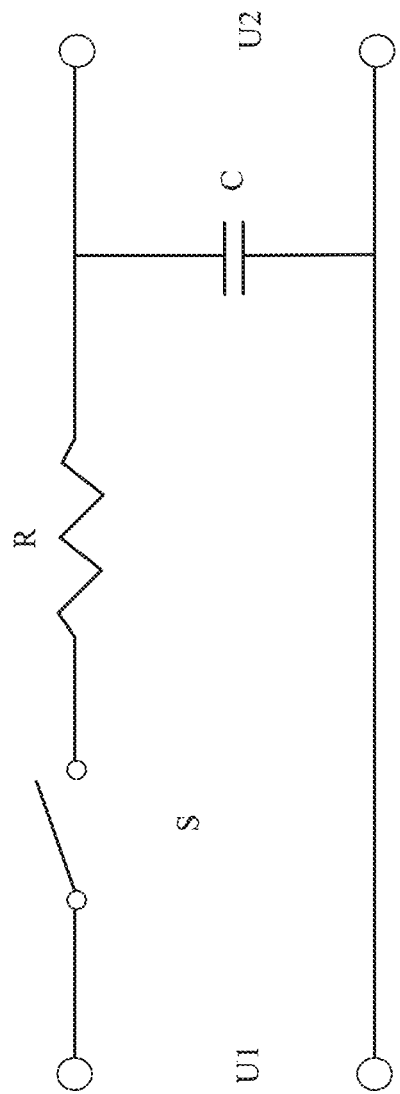
FIG. 13 is a schematic structural diagram of a delay control circuit according to some embodiments of this application.

FIG. 13 is a schematic structural diagram of a delay control circuit according to some embodiments of this application.

Referring to FIG. 13, before the delay control circuit is powered on, for example, before a switch S is turned on, a voltage U2 between two terminals of a capacitor C is 0 V, which is a stable state. When the switch S is turned on, the voltage U2 between the two terminals of the capacitor C gradually rises and finally reaches a value U1 of electromotive force of a power supply, and can maintain the value. In this case, the delay control circuit is in another stable state, where U2=U1.

Herein, the voltage U2 between the two terminals of the capacitor C changes from U2=0 to U2=U1 gradually rather than instantaneously after the switch S is turned on. Duration of the process varies with values of a resistor R and the capacitor C. This characteristic can be used to implement a delay function, and a delay circuit with specific delay duration can be implemented by selecting elements with specific resistance and capacitance values. It should be noted that, in order to implement the foregoing gradual change process, an energy storage element in the circuit may be used, for example, an inductance element can also be used in addition to a capacitance element. An RC circuit used in some embodiments implements the delay function. In addition, disposing an element with a switching function, for example, a transistor, in the RC circuit can implement a delay switching function.

For example, delay duration t of the delay circuit can be calculated via formula (7).

$$t = -R \times C \times \text{Ln}((E-V)/E) \quad \text{formula (7)}$$

Herein, the resistor R and the capacitor C are connected in series, resistance of the resistor R is in a unit of ohm, and capacitance of the capacitor C is in a unit of F. E is a voltage between the resistor and the capacitor connected in series, and V is a voltage of the capacitor. Ln is the natural logarithm. For example, when R=50 K and C=3 mF, the voltage of the capacitor is 12 V, and therefore, when a voltage between the two electrodes of the capacitor C reaches 5 V, duration is: $-(50 \times 1000 \times 3/1000) \times \text{Ln}((12-5)/12) = 24.3$ (seconds).

The embodiment of the comparator and the delay circuit is shown above. For ease of a more comprehensive understanding of the technical solution in this application, the first reference time period determining circuit and the like are exemplarily described below.

In some embodiments, in order to effectively detect clock signal anomaly caused by an external factor, for example, to avoid detection result anomaly caused because the reference clock signal is also affected by the external factor, the detection circuit of clock anomaly in some embodiments is also provided with a reference clock generating unit for generating a reference clock signal.

Herein, a frequency of generating the reference clock signal (referred to as a second clock signal below) by the reference clock generating unit may be the same as or different from a frequency of the first clock signal. For example, a crystal oscillator with the same oscillation frequency as that in the first clock generating unit may be disposed in the second clock generating unit, for example, the second clock generating unit may include a crystal oscillator, a crystal oscillator control chip, and a capacitor. For example, an oscillator circuit may be provided in the second clock generating unit to reduce the cost of generating the second clock signal.

In some embodiments, the first reference time period determining circuit further includes: a second clock generating unit, connected to the second counter and configured to output the second clock signal to the second counter. Herein, the second clock generating unit may include the oscillator circuit.

Reasons why the oscillator circuit is used to generate the second clock signal in some embodiments is as follows: On the one hand, the chip and the crystal oscillator are respectively made of silicon and quartz, which are not easy to integrate into the same circuit and are costly. On the other hand, once the crystal oscillator is packaged inside the chip, an oscillation frequency is fixed and is not easy to change. Although the fixed oscillation frequency can be adjusted via, for example, frequency multiplication/division of a phase-locked loop (PLL), the cost is relatively high. In addition, disposing an independent oscillator circuit in the first reference time period determining circuit facilitates a reduction in the cost of the detection circuit of clock anomaly, and a reduction in a risk that the second clock signal and the first clock signal are interfered by the same interference source.

Herein, the oscillator circuit may be an RC oscillator circuit, an LC oscillator circuit, or the like. The RC oscillator circuit has an RC frequency selection network, is suitable for low-frequency oscillation, and is configured to generate a signal of a low frequency of 1 Hz to 1 MHz (megahertz). For the RC oscillator circuit, increasing the resistance of the resistor R can reduce the oscillation frequency without increasing the cost. If the LC oscillator circuit is used, a sine wave with a higher frequency can be generated. If sinusoidal oscillation with a lower frequency needs to be generated, an oscillation loop needs a greater inductor and capacitor, and the required elements are larger in size and more costly than those in the RC oscillator circuit. For example, for a sinusoidal oscillator circuit below 200 kHz, the RC oscillator circuit with a lower oscillation frequency can be used.

For example, the RC oscillator circuit can use an RC phase-shift oscillator. The oscillation frequency of the RC phase-shift oscillator is: $f = 1/(2\pi RC)$. The RC oscillator circuit can be formed by combining the RC series-parallel frequency selection network and an amplifier. The amplifier can use an integrated operational amplifier.

In some embodiments, an RC series-parallel frequency selection network is connected between an output terminal and a non-inverting input terminal of the operational amplifier to form positive feedback. In addition, the resistor is connected between the output terminal and an inverting input terminal of the operational amplifier to form negative feedback. A positive feedback circuit and a negative feedback circuit form a Wien bridge oscillator circuit, and input and output terminals of the operational amplifier are respectively connected across a diagonal of the bridge to form an RC bridge oscillator circuit. In addition, the oscillation frequency can be easily adjusted by using a dual adjustable potentiometer or a dual adjustable capacitor. For example, the frequency can be adjusted by switching to a capacitor with high stability, and the frequency can be fine-tuned by using the dual variable potentiometer.

In some embodiments, the detection circuit of clock anomaly may further include: a first reference time period configuration unit, to easily configure data such as a comparison threshold.

For example, a first reference time period configuration unit is connected to the first count comparator and configured to store the first preset difference threshold and/or the second preset difference threshold, and transmit the first preset difference threshold and/or the second preset difference threshold to the first count comparator.

Further referring to FIG. 6, the first frequency of the first clock signal and the second frequency of the second clock signal may be the same or different. For example, when the first frequency of the first clock signal is the same as the second frequency of the second clock signal, the error problem is considered (for example, accuracy of the clock signal generated by the RC oscillator circuit may be lower than accuracy of the clock signal generated based on the crystal oscillator, resulting in a specific difference between numbers of pulse signals included in the same time period T1; and at this time, the problem can be eliminated by setting an error (for example, a first preset difference threshold)). For example, when the first frequency of the first clock signal is different from the second frequency of the second clock signal, the numbers of pulse signals that should be included in the same time period T1 can be determined, so that a second preset difference threshold can be set based on a difference between the numbers of the pulse signals that should be included. It should be noted that the second preset difference threshold may include a difference caused by an error.

In some embodiments, first, before the circuit is used, valid high-frequency and low-frequency count ranges are configured into the first reference time period configuration unit, to compare the numbers of pulses subsequently.

Next, the first clock signal is received (for example, a first clock signal provided by a system, where the first clock signal is used by all functional circuits of the system). The received first clock signal is transmitted to the clock anomaly detection unit for counting.

Then, the clock anomaly detection unit detects clock anomaly at intervals. For example, when detection needs to be started, the counting control unit transmits an enabling signal to the first counter and the second counter, so that the two counters start counting.

The first counter performs counting on a to-be-detected clock, and the second counter performs counting on the second clock signal generated by a built-in RC oscillator circuit. Herein, the built-in RC oscillator circuit is responsible for generating a stable low-frequency clock, which is used as a reference clock to measure the to-be-detected clock.

When a count on the second counter reaches a preset value, for example, after 1000 clock cycles, a completion identifier is then transmitted to a counting control unit.

After receiving a counting completion identifier from the second counter, the counting control unit controls the counter at the same time to stop counting, transmits counts of the first counter and the second counter to the first count comparator, and outputs a comparison enabling signal to the count comparator at the same time to start comparing values.

The first count comparator makes comparison based on a difference between two received counts and valid high-frequency and low-frequency count ranges configured by the user, to determine whether the difference between the two counts is within the valid range. The frequency is valid if the difference is within the valid range. If the difference is greater than the configured maximum count or less than the minimum count, the frequency is considered to be invalid. If the difference is greater than the configured maximum count, this indicates that the frequency is excessively high. If the difference is less than the minimum count, the frequency is considered to be excessively low. For example, the difference between the count on the first counter and the count on the second counter is 1000, and if the valid range is 980 to 1020, assuming that the difference exceeds the range, an invalid frequency is considered to exist.

The first count comparator can transmit a detection result to the interrupt signal generating module and/or the reset signal generating module, to generate an interrupt signal and/or a reset signal. For example, the interrupt signal enables the CPU to perform invalid clock processing. The reset signal can reset key signals in a key information cache unit in the chip, so that these signals return to a reset value state, which can also prevent a hacker from obtaining these key signals.

Some embodiments of this application provide a safe circuit design solution with a clock real-time monitoring function, which can automatically detect whether an invalid high-frequency or low-frequency signal appears in the clock signal, and send an interrupt and/or reset signal after detecting clock anomaly, to protect the system.

In some embodiments of this application, based on a design of a digital circuit, a monitoring circuit can be implemented by using a digital circuit, and the digital circuit method is much better than an analog circuit in terms of cost and stability.

In some embodiments, in order to improve generalizability of the clock anomaly detection solution, for a relevant application scenario of clock anomaly detection of a node (for example, a controller, a host computer, or a computer) in a network, there may be no need to add an oscillator circuit for generating a second clock signal, or the like. In some embodiments, the timestamp can be obtained by parsing a packet transmitted over the network, and anomaly detection can be performed on the clock signal based on the timestamp.

In some embodiments, the second reference time period determining circuit may include a time unpacking unit.

The time unpacking unit is connected to a first network and configured to parse a packet received from the first network to obtain a timestamp, where the packet transmitted via the first network has the timestamp, to sort multiple received packets based on a chronological sequence of timestamps.

For ease of understanding, a time-sensitive networking (TSN) is used for illustration. TSN is a protocol family for implementing deterministic minimum delay in non-deterministic Ethernet, is a set of protocol standards developed by the TSN task group in the IEEE 802.1 working group, and defines a time-sensitive mechanism of data transmission over Ethernet, which adds determinism and reliability to standard Ethernet to ensure real-time, deterministic, and reliable transmission of data. A packet supporting the TSN network needs a timestamp. After arriving, the data is played back based on a "timestamp" of a packet header. Therefore, each network terminal device has to perform "clock synchronization", that is, clock calibration.

A protocol data unit (PDU) of a physical layer is a bit, a PDU of a data link layer is a frame, a PDU of a network layer is a packet or a message, and a PDU of a transport layer is a segment.

A message is a data unit exchanged and transmitted over a network, and is also a unit of network transmission. The message includes complete to-be-sent data information whose lengths are not necessarily consistent. During a transmission process, the message is continuously encapsulated into a group, a packet, and a frame for transmission. An encapsulation method is to add some control information to form the header, that is, a message header.

The packet is a unit in a binary format in network transmission, and is a data unit in transmission based on TCP/IP communication protocols. A basic data unit transmitted through the network includes a header and the data, and the header describes a destination of the data and its relationship with other data, which can be understood as a group in data transmission. Herein, the basic data unit transmitted through the network is referred to as a datagram.

A packet of the transport layer is captured via a packet capture operation, and the packet, the frame, the datagram, and the segment exist in the same record, and are named differently based on their different protocol layers.

For example, a log includes the following information: 11x.9x.1xx.xx-13575743 "GET http://www.examples.com/index.htm HTTP/1.1" 200 14702 "http://www.examples.com/" "Moz/4.0 (compatible; MSIE 6.0; Windows NT x.1; SVx)" TCP_HIT:NONE 1.

Herein, a fourth field 13575743 of the log is a timestamp, which is a number of seconds since 1970-01-01 00:00:00 UTC. A timestamp is a sequence of characters that can provide an actual date and time (sometimes as precise as a fraction of a second) to help identify time when a specific event occurs. An arrival interval of the minimum 64-byte packet in a Gigabit network is 0.512 microseconds, that is, 512 nanoseconds.

In some embodiments, a built-in function can be used for conversion, for example, #head access.log|awk'{print strftime("% y/% m/% d % T",$4)}'.

Hardware decoding is used as an example for illustration. A received message includes the following character string: . . . 68 2c 86 6f00 00 00 6f0a 08 00 . . . . Second information is: 0x6f862c68, and microsecond information is: 0x080a6f. In this way, a full timestamp can also be parsed.

A timestamp extraction process depends on how a first timestamp is added. The first timestamp may be protected via at least one of integrity protection, authentication protection, and encryption, and therefore, when applicable, extraction involves a reversal of these operations. Therefore, the extraction may involve integrity verification, authentication verification, and decryption.

In some embodiments, the clock anomaly detection unit includes a second count comparator, the second count comparator includes a buffer unit, and the buffer unit is configured to receive the timestamp in response to the second count comparator and store a count received from the first counter. In some embodiments, after the clock anomaly detection unit is powered on, the first counter starts to work, and the time unpacking unit starts to capture and unpack a packet, and outputs an unpacked timestamp to the count comparator. The count comparator includes a buffer that stores a first time count value received from the first counter in response to the first timestamp. The count comparator compares the first time count value with the second time count value received from the first counter in response to the second timestamp to obtain a clock monitoring result. In addition, the first time count value may be replaced with a second time count value. The foregoing operations are repeated until the clock anomaly detection unit is powered off.

It should be noted that after completing a round of count comparison, the count comparator may output, for example, an initialization signal to the first counter, so that the first counter restarts counting, thereby reducing a risk of data overflow.

In some embodiments, the detection circuit of clock anomaly may further include; a second reference time period configuration unit. For example, the second reference time period configuration unit is connected to the clock anomaly detection unit and configured to store a mapping relationship between a timestamp difference and a preset difference threshold, so that the clock anomaly detection unit finds the preset difference threshold corresponding to the timestamp difference. Herein, a process of determining a mapping relationship may be as follows.

Referring to FIG. 9, a number of pulses (estimated count 2) corresponding to the first clock signal can be calculated based on a time period T2 between two timestamps. Then the pulses of the first clock signal are counted, to easily compare count 1 with the estimated count 2 to determine whether there is clock anomaly.

FIG. 9 shows an application scenario in which the expected count 2 is determined based on the clock frequency of the first clock signal. In addition, the estimated count 2 may also be determined with a preset clock frequency. For example, the preset clock frequency is different from the clock frequency of the first clock signal. In addition, the estimated count 2 can be determined in a manner such as calibration or calculation. A preset difference threshold corresponding to a timestamp difference can be determined in the foregoing manner.

In some embodiments, a TSN network timestamp parsing unit is added next to an original RC circuit. The TSN network can be used as a vehicle-mounted time-sensitive network, where a timestamp in transmitted data can be used for time synchronization of the radar.

The second reference time period configuration unit is configured to store the maximum and minimum valid values of a corresponding clock counter when the RC oscillator circuit is used for the reference count, and store the maximum and minimum valid values of the corresponding clock counter when the timestamp of the TSN network is used as the reference time period.

The time unpacking unit is configured to: parse timestamp information from the TSN network packet, where the timestamp includes precise time information; and transmit the timestamp information to the second reference time period configuration unit and the count comparison unit. Because there is a precise time difference between every two timestamps, the maximum and minimum valid values of a valid clock counter corresponding to the TSN timestamp can be configured as a standard for determining whether the clock is normal.

Either the RC oscillator circuit or the TSN network can be used as a time reference to measure the clock generated by the clock generating unit.

In some embodiments, the first reference time period determining circuit and the second reference time period determining circuit may also be used in conjunction. For example, when the obtained result is that the clock is abnormal after the anomaly detection is performed on the first clock signal based on the first reference time period determining circuit, the anomaly detection can be further performed on the first clock signal based on the second reference time period determining circuit to verify the detection result based on the first reference time period determining circuit. For another example, weights of detection results determined based on the first reference time period determining circuit and the second reference time period determining circuit respectively are W1 and W2, and therefore, respective abnormal scores can be weighted and summed based on the two weights, to improve accuracy of the test result.

It should be noted that each of the first preset difference threshold and the second preset difference threshold may include multiple levels: a low-quality threshold level, an anomaly threshold level, and the like. Herein, when the clock frequency of the first clock is greater than the anomaly threshold level and less than the low-quality threshold level, a reset signal may be output. The quality of the clock is improved via the reset signal. It should be noted that the foregoing condition for outputting the reset signal is only illustrative and should not be construed as a limitation on this application. In some embodiments, the reset signal resets the main circuit and clears key information. When the clock frequency of the first clock is greater than the anomaly threshold level and the low-quality threshold level, an interrupt signal may be output.

It should be noted that the foregoing condition for outputting the interrupt signal is only illustrative and should not be construed as a limitation on this application. The potential risk of the abnormal clock to the user is reduced via the interrupt signal. In some embodiments, the interrupt signal can be sent to a central processing unit (CPU), so that the CPU can perform corresponding processing in response to the interrupt signal based on an interrupt type, for example, damage of important information, and restarting and shutting down of the first clock generating unit. Besides, in addition to reset, interrupt processing, and the like, another processing method can also be introduced, for example, replacement of a clock generating unit channel and alarming, which is not limited herein.

Figure 14:
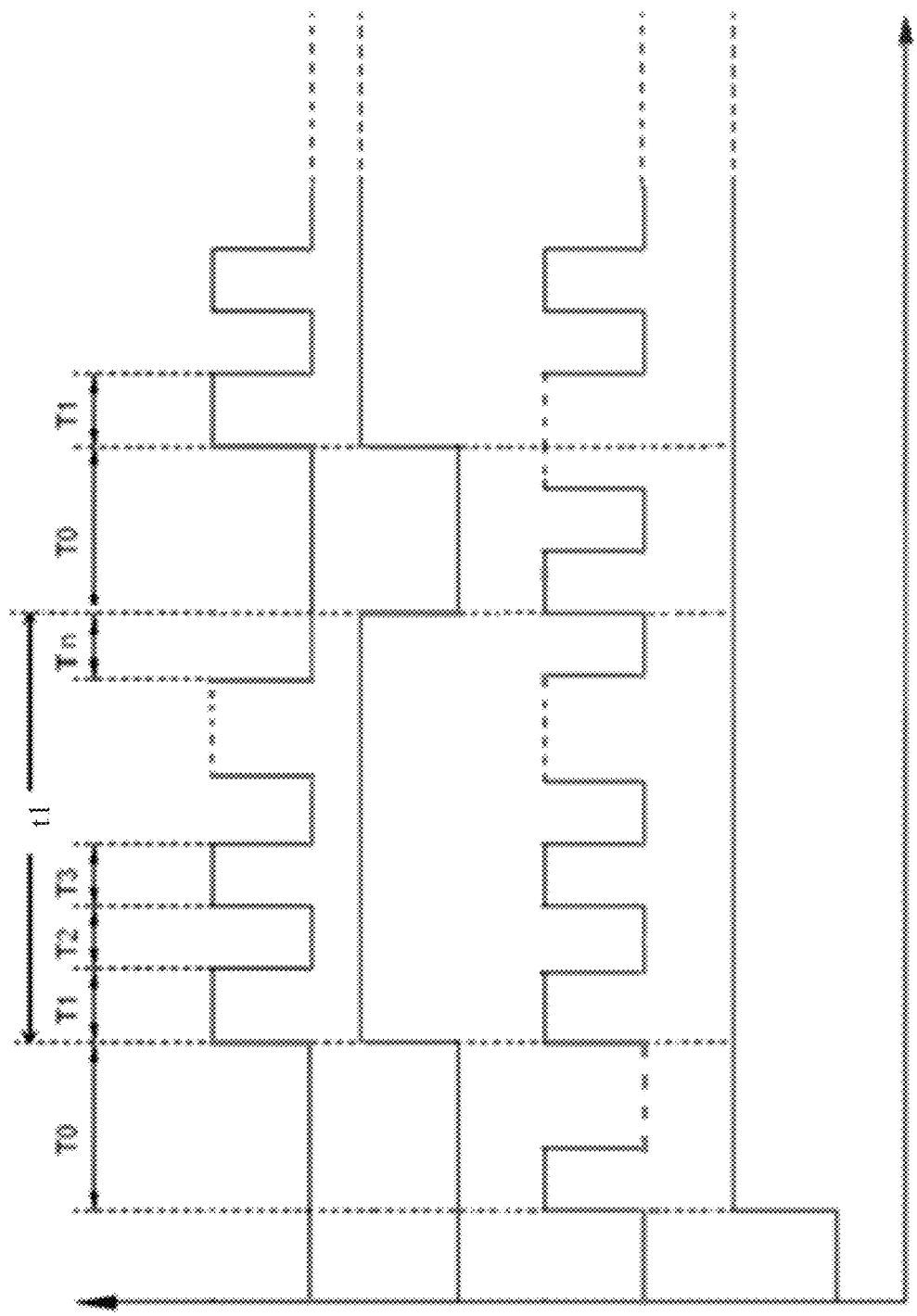
FIG. 14 is a sequence diagram of a detection circuit of clock anomaly according to some embodiments of this application.

FIG. 14 is a sequence diagram of a detection circuit of clock anomaly according to some embodiments of this application.

Referring to FIG. 14, the sequence diagram sequentially shows a power-on signal, a first clock signal, an enabling signal and a second clock signal from bottom to top. After being powered on, the detection circuit of clock anomaly receives the first clock signal output by the first clock generating unit. The counting control unit sends an enabling signal to the first counter and the second counter, and length t1 of a high-level segment in the enabling signal can be divided into two types: 1. length of time during which the count on the first counter reaches a preset number of pulses (T1+T2+T3+ . . . +Tn, where n is the number of preset pulses); and 2. preset time length, where the preset time length can be set, which is not limited herein. Due to the high clock frequency (the count may be very great), if the length of time during which the count on the first counter reaches the preset number of pulses is used, a risk of count overflow due to inappropriate preset time length can be effectively reduced, and precision of anomaly detection is improved.

Length of the time period T0 in FIG. 14 may be determined by the counting control unit. For example, the length of T0 is determined by the delay control circuit. In some embodiments, the length can be calculated by formula (7). The first clock frequency of the first clock signal and the second clock frequency of the second clock signal shown in FIG. 14 may be the same or different.

The detection circuit of clock anomaly provided in this application can be applied to multiple fields such as precise three-dimensional (3D) modeling, detection, home improvement, autonomous driving, and unmanned aerial vehicles.

The detection circuit of clock anomaly provided in this application can automatically detect whether an invalid high-frequency or low-frequency signal appears in the clock signal output by the clock generating unit, and send interrupt and reset signals after detecting clock anomaly, to instruct the system to protect and handle the main control chip.

Another aspect of this application also provides a clock circuit.

The clock circuit may include a first clock generating unit and a detection circuit of clock anomaly.

Herein, the first clock generating unit is configured to output a first clock signal. As described above, the detection circuit of clock anomaly is connected to the first clock generating unit and configured to detect the first clock signal. For example, the first clock generating unit may include a device such as a quartz crystal oscillator.

In some embodiments, the foregoing detection circuit of clock anomaly may further include a multiplexer (MUX).

Herein, the multiplexer is connected to a clock anomaly detection unit and configured to output the first clock signal when a clock of the first clock signal is normal, or output a second clock signal when the clock of the first clock signal is abnormal.

Figure 15:
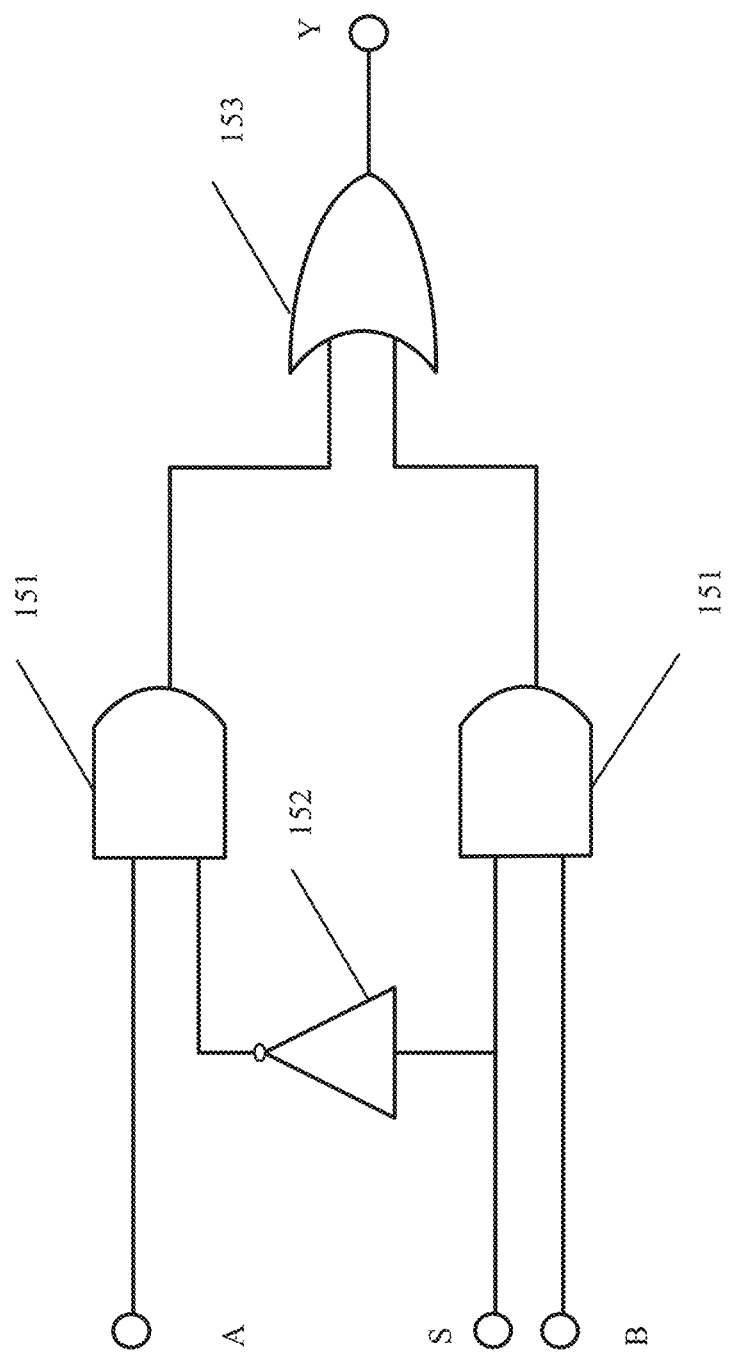
FIG. 15 is a schematic structural diagram of a multiplexer according to some embodiments of this application.

FIG. 15 is a schematic structural diagram of a multiplexer according to some embodiments of this application.

Referring to FIG. 15, the multiplexer can be an alternative selector. It should be noted that, in order to replace the path of the clock signal, at least one of a wiring switch and a look-up table (LUT) circuit may also be used.

In some embodiments, implementation logic of the alternative MUX can be a formula (8) shown below.

$$Y = \overline{S}A + SB \quad \text{formula (8)}$$

Herein, Y is a signal output by the MUX, S is a control signal, $\overline{S}$ means non-S, and A and B are two signals input into the MUX.

In FIG. 15, the alternative selector is formed based on an AND gate 151, a NOT gate 152 and an OR gate 153. It should be noted that the circuit shown in FIG. 15 is only exemplary, and logic circuits can also be used to implement the multiplexer. Logical circuits include, but are not limited to, an "OR operation circuit", an "AND operation circuit", a "NOT operation circuit", an "OR NOT operation circuit", an "AND NOT operation circuit", and an "Exclusive OR operation circuit".

The multiplexer provided in some embodiments is configured to switch the clock of the functional circuit to the built-in reference clock when determining that the current clock signal is invalid, to prevent the functional circuit from working as per the invalid clock. When the clock signal is normal, the path corresponding to the first clock generating unit is used. This ensures that functions based on the clock signal can be implemented, thereby improving personal safety and the property safety of the user.

Another aspect of this application also provides a chip. The chip may include the foregoing clock circuit, and a functional circuit that implements a specific function based on a clock signal output by the clock circuit. The functional circuit includes, but is not limited to, a processor, an emitter, and a receiver.

In some embodiments, another aspect of this application further provides a board, including a storage device, an interface device, a control device, and the foregoing chip. Herein, the chip is respectively connected to the storage device, the control device, and the interface device. The storage device is configured to store data. The interface device is configured to implement data transmission between an artificial intelligence chip and a peripheral device. The control device is configured to monitor a state of the artificial intelligence chip.

Another aspect of this application also provides a clock anomaly detection method.

Figure 16:
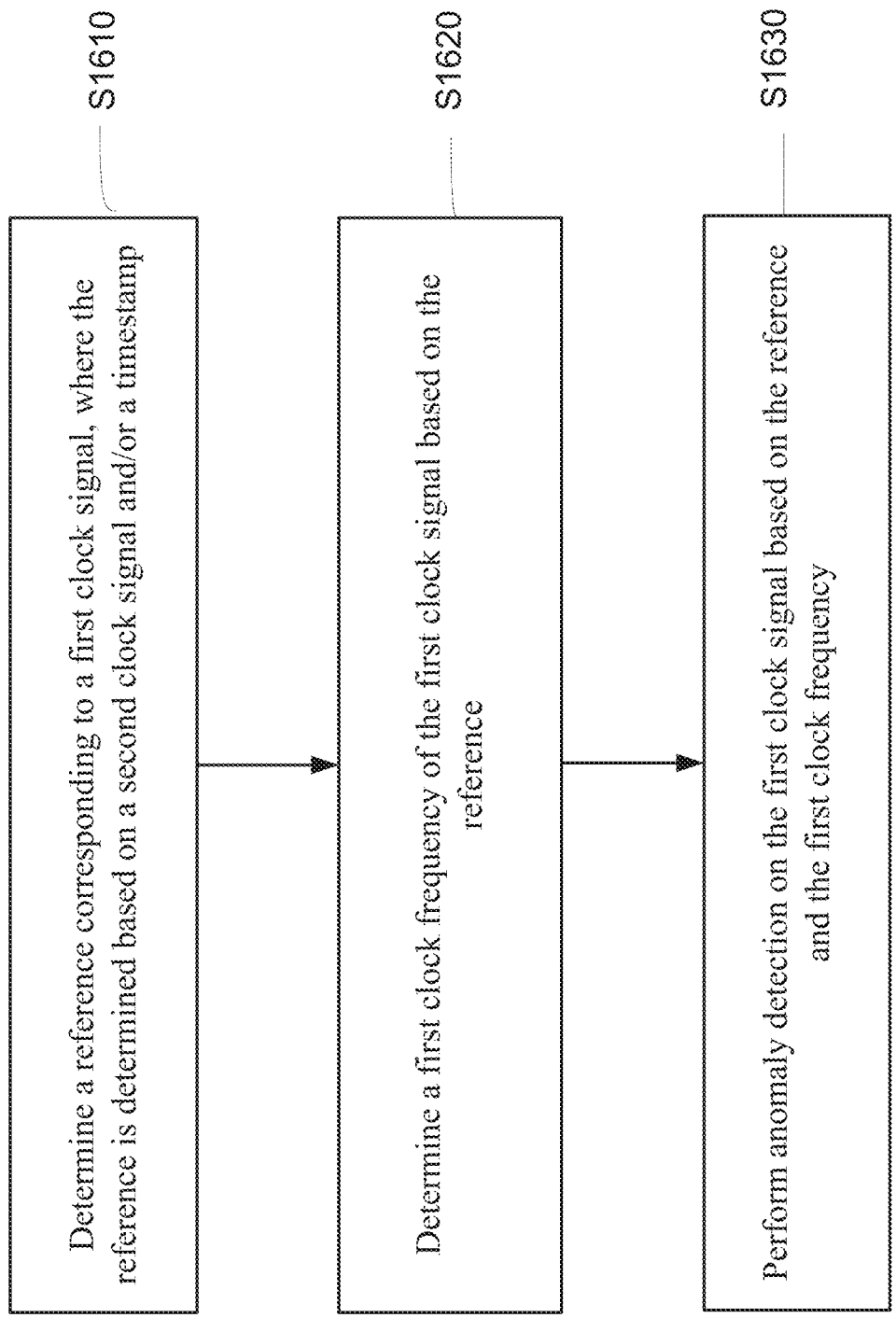
FIG. 16 is a schematic flowchart of a clock anomaly detection method according to some embodiments of this application.

FIG. 16 is a schematic flowchart of a clock anomaly detection method according to some embodiments of this application.

Referring to FIG. 16, the clock anomaly detection method may include Step S1610 to Step S1630.

Step S1610: Determine a reference corresponding to a first clock signal. Herein, the reference is determined based on a second clock signal and/or a timestamp.

Step S1620: Determine a first clock frequency of the first clock signal based on the reference.

Step S1630: Perform anomaly detection on the first clock signal based on the reference and the first clock frequency.

In some embodiments, determining a reference corresponding to a first clock signal may include the following operations.

For example, a first reference time period during which a number of pulses of the second clock signal reaches a first count value is determined.

For example, a second reference time period is determined, where the second reference time period is a time period between respective timestamps of two packets.

In some embodiments, determining a reference corresponding to a first clock signal may include: determining a first reference time period and/or a second reference time period, where the first reference time period is a time period during which a number of pulses of the second clock signal reaches a first count, and the second reference time period is a time period between respective timestamps of two packets.

In some embodiments, a pulse of a second clock signal is counted in response to a first enabling signal until a preset first count value is reached, and a counting completion signal is output. In addition, a pulse of a first clock signal is counted in response to a first enabling signal until the counting completion signal is received, and a second count value is obtained. The second count value can be used to characterize the first clock frequency.

Correspondingly, determining a first clock frequency of the first clock signal based on the reference may include the following operation: for example, determining a second count value for a number of pulses of the first clock signal within the first reference time period. For example, a second count value is determined for a number of pulses of the first clock signal within the second reference time period.

Herein, determining a second count value for a number of pulses of the first clock signal within the second reference time period may include the following operation. First, in response to an obtained first timestamp, a first time count value corresponding to the first timestamp is obtained. Then, in response to an obtained second timestamp, a second time count value corresponding to the second timestamp is obtained. Next, a difference between the second time count value and the first time count value is used as the second count value.

In some embodiments, performing anomaly detection on the first clock signal based on the first clock frequency and the reference time period may include: if a difference between the first count value and the second count value is within a difference threshold range, determining that the first clock signal is normal, where the difference threshold range includes a first difference threshold and a second difference threshold, and the second difference threshold is greater than the first difference threshold. In some embodiments, a count difference may be compared with a first preset difference threshold, and/or the count difference may be compared with a second preset difference threshold to perform anomaly detection on the first clock signal, where the count difference is a difference between the first count value and the second count value, and the first preset difference threshold is different from the second preset difference threshold.

In some embodiments, the foregoing method may also include the following operation: when an anomaly detection result of the first clock signal is abnormal, using the second clock signal as a clock signal of a functional circuit.

In some embodiments, determining a second count value of pulses of the first clock signal within the second time period may include the following operation: parsing a packet received from the first network to obtain a timestamp, where the packet transmitted via the first network has the timestamp, to sort multiple received packets based on a chronological sequence of timestamps.

In some embodiments, the foregoing method may also include at least one of the following operations: outputting an interrupt signal when the first clock signal is abnormal, or outputting a reset signal when the first clock signal is abnormal.

Another aspect of this application also provides a clock anomaly detection apparatus.

Figure 17:
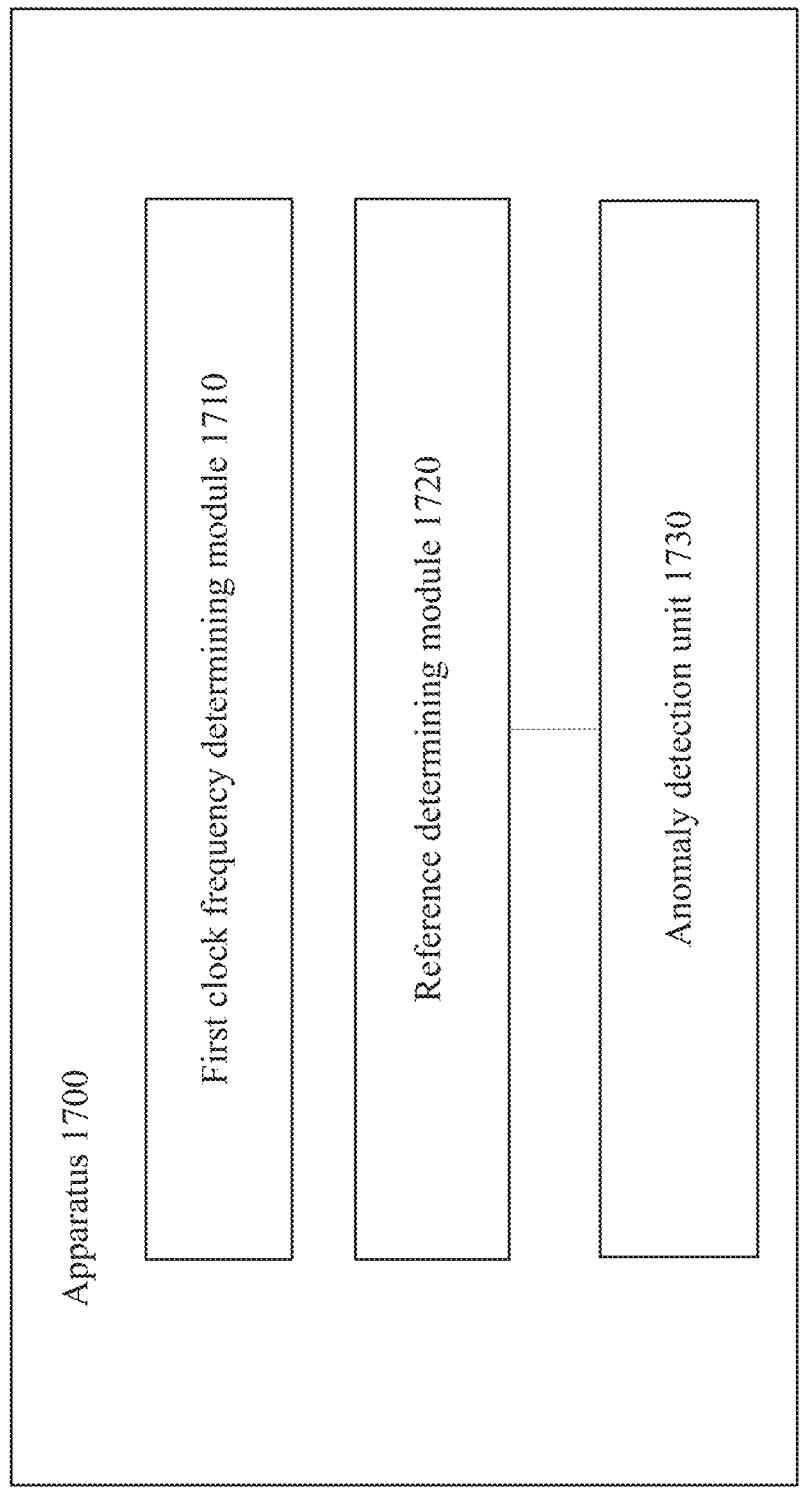
FIG. 17 is a schematic structural diagram of a clock anomaly detection apparatus according to some embodiments of this application.

FIG. 17 is a schematic structural diagram of a clock anomaly detection apparatus according to some embodiments of this application.

Referring to FIG. 17, the clock anomaly detection apparatus 1700 may include a first clock frequency determining module 1710, a reference determining module 1720 and an anomaly detection unit 1730.

The first clock frequency determining module 1710 is configured to determine a first clock frequency of a received first clock signal.

The reference determining module 1720 is configured to determine a reference corresponding to the first clock signal, where the reference is determined based on a second clock signal and/or a timestamp.

The anomaly detection unit 1730 is configured to perform anomaly detection on the first clock signal based on the first clock frequency and the reference.

For the apparatus in some embodiments, how the modules implement the operations has been described in the embodiments of the method in detail, and no further elaboration is provided herein.

Another aspect of this application also provides a radar. The radar may include the foregoing chip or board.

Figure 18:
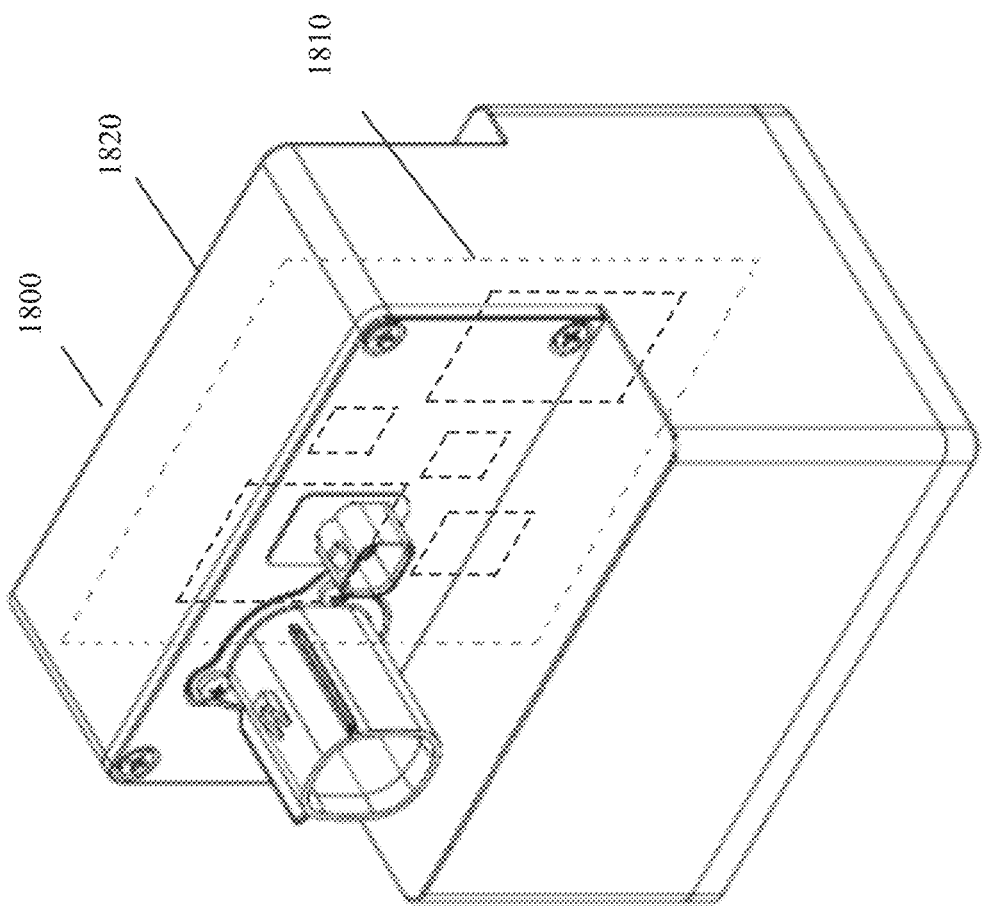
FIG. 18 is a schematic structural diagram of a radar according to some embodiments of this application.

FIG. 18 is a schematic structural diagram of a radar according to some embodiments of this application.

Referring to FIG. 18, a radar 1800 may include the foregoing chip or board, and the chip and/or board may include the foregoing clock circuit. In some embodiments, the clock circuit may include the foregoing detection circuit of clock anomaly. The clock circuit can be provided on the board 1810, and the board 1810 can be provided with multiple chips, for example, central control chips. The board 1810 may be provided in a housing 1820.

The radar may be LiDAR, a millimeter-wave radar, an ultrasonic radar, or the like. The radar can be a scanning radar or a non-scanning radar.

Scanning LiDAR is used as an example for illustration below.

For example, MEMS LiDAR can dynamically adjust its scanning pattern to focus on a special object, collect detailed information about a farther and smaller object, and identify the object. The MEMS LiDAR has a small inertia torque, can move quickly, and is fast enough to track a 2D scan pattern in less than a second.

For example, flash LiDAR can quickly record the entire scene, avoiding all kinds of problems caused by movement of a target or the LiDAR in a scanning process. A radar system uses an array of tiny sensors to collect laser beams reflected back in different directions.

For example, a row of emitters mounted on phased array LiDAR can change the direction of the laser beam by adjusting a relative phase of the signal.

For example, mechanical rotary LiDAR is relatively early developed LiDAR, and its technology is currently relatively mature, but a structure of a mechanical rotary LiDAR system is very complicated, and core components are quite costly, which mainly include a laser, a scanner, an optical component, a photodetector, a receiving IC, a position, a navigation device, and the like.

Using MEMS solid-state LiDAR as an example, because the MEMS solid-state LiDAR performs scanning through a simple harmonic motion of a galvanometer, a scanning path of the scanning sensor can implement, for example, a scanning field of view with a reciprocating motion from top to bottom on a slow axis and a reciprocating motion from left to right on a fast axis in a spatial sequence. Therefore, a detection range of the MEMS solid-state LiDAR is divided by dividing an angle of view corresponding to the slow axis.

For example, the slow axis of the MEMS solid-state LiDAR corresponds to a vertical angle of view of −13° to 13°.

Using the mechanical LiDAR in the scanning sensor as an example, the mechanical LiDAR performs scanning by driving an optical system to rotate 360 degrees through a mechanical drive device, to form a cylindrical detection region with the LiDAR as the center. Therefore, a detection range corresponding to 360° rotation of the mechanical LiDAR is a detection range corresponding to detection of one data frame, and therefore, a detection range of the mechanical LiDAR in one cycle is usually divided based on a degree of rotation.

The non-scanning LiDAR processes an image by using an internal photosensitive component circuit and a control component, converts the image into a digital signal identifiable to a computer, and then inputs the digital signal into the computer through a parallel port or a USB connection, to recover the image by using software.

Another aspect of this application also provides an electronic device, including the foregoing artificial intelligence chip. The electronic device includes a data processing apparatus, a robot, a radar, a computer, a printer, a scanner, a tablet computer, a smart terminal, a mobile phone, a driving recorder, a navigator, a sensor, a webcam, a server, a cloud server, a camera, a video camera, a projector, a watch, a headphone, mobile storage, a wearable device, a transportation tool, home appliances, and/or medical equipment. The transportation tool includes an aircraft, a ship and/or a vehicle. The household appliances include a television, an air conditioner, a microwave oven, a refrigerator, a rice cooker, a humidifier, a washing machine, an electric light, a gas stove, a range hood, or the like. The medical equipment includes a nuclear magnetic resonance machine, an ultrasound machine and/or an electrocardiograph.

Figure 19:
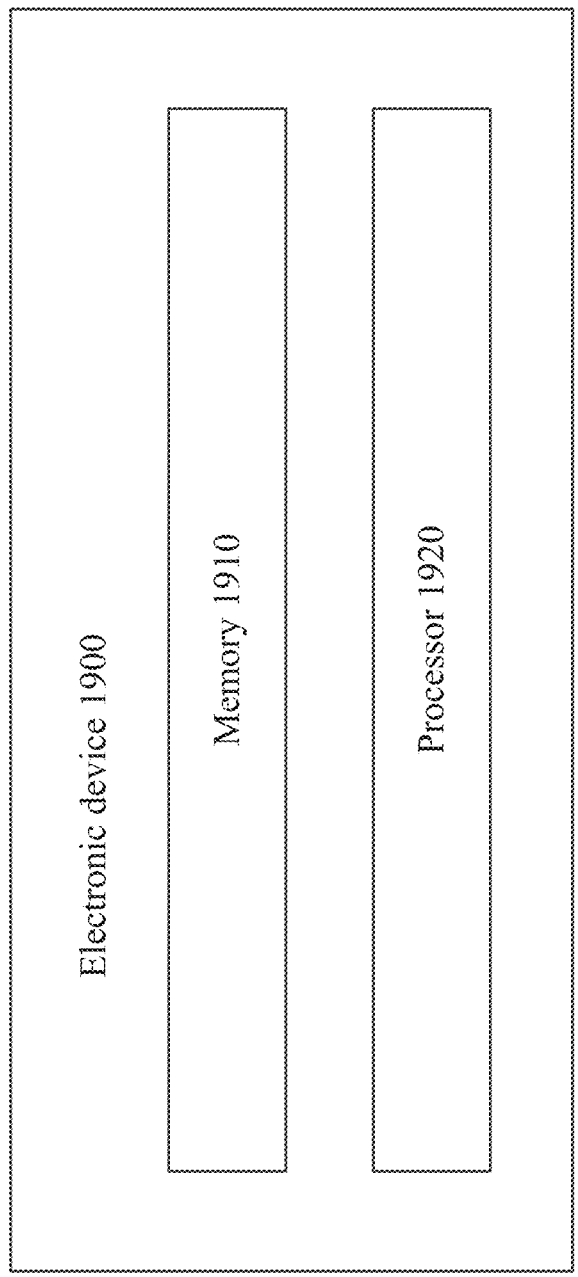
FIG. 19 is a schematic structural diagram of an electronic device according to some embodiments of this application.

FIG. 19 is a schematic structural diagram of an electronic device according to some embodiments of this application.

Referring to FIG. 19, an electronic device 1900 may include a memory 1910 and a processor 1920. In addition, the electronic device 1900 may also be provided with at least one of a clock generating circuit, a detection circuit of clock anomaly, or a radar.

The processor 1920 may be a central processing unit (CPU), or may be another general-purpose processor, a digital signal processor (DSP), an application specific integrated circuit (ASIC), a field-programmable gate array (FPGA) or another programmable logic device, a discrete gate or transistor logic device, a discrete hardware component, or the like. The general-purpose processor may be a microprocessor, or the processor may be any conventional processor or the like.

The memory 1910 may include various types of storage units such as a system memory, a read-only memory (ROM), and a persistent storage. Herein, the ROM can store static data or an instruction required by the processor 1920 or another module of the computer. The persistent storage may be a readable/writable storage. The persistent storage may be a non-volatile storage that does not lose stored instructions and data even if the computer is powered off. In some embodiments, the persistent storage uses a large-capacity storage (for example, a magnetic or optical disk, or a flash memory). In some embodiments, the persistent storage may be an erasable storage (for example, a floppy disk or a CD-ROM drive). A system memory can be the readable/writable storage or a volatile readable/writable storage, for example, a dynamic random access memory. The system memory can store some or all of instructions and data required by the processor during running. In addition, the memory 1910 may include any combination of computer-readable storage media, including various types of semiconductor memory chips (for example, a DRAM, an SRAM, an SDRAM, a flash memory, and a programmable read-only memory), and the magnetic disk and/or the optical disk may also be used. In some embodiments, the memory 1910 may include a readable and/or writable erasable storage, for example, a compact disc (CD), a read-only digital versatile disc (for example, a DVD-ROM or a dual-layer DVD-ROM), a read-only Blu-ray disc, a super density disc, a flash card (for example, an SD card, a min SD card, and a Micro-SD card), and a magnetic floppy disk. The computer-readable storage media do not include a carrier wave or a transient electronic signal transmitted by wireless or wire.

Executable code is stored in the memory 1910, and when being processed by the processor 1920, the executable code may enable the processor 1920 to perform a part or all of the foregoing method.

In addition, the method according to this application can also be implemented as a computer program or a computer program product, where the computer program or the computer program product includes a computer program code instruction for executing some or all of the steps in the foregoing method in this application.

In some embodiments, this application may be implemented as a computer-readable storage medium (or a non-transitory machine-readable storage medium or a machine-readable storage medium) storing executable code (or a computer program or computer instruction code), and when the executable code (or a computer program or computer instruction code) is executed by a processor (a server, or the like) of the electronic device, the processor executes some or all of the steps in the foregoing method in this application.

The embodiments of this application are described above, but the foregoing description is exemplary other than exhaustive, and is not limited to the disclosed embodiments. Various modifications and alterations shall be evident to a person of ordinary skill in the art without departing from the scope and spirit of the described embodiments. The terms used herein are intended to optimally explain the principle of each embodiment, actual application, or improvement of technologies in the art, or help other persons of ordinary skill in the art understand the embodiments disclosed herein.

What is claimed is:

1. A detection circuit of clock anomaly, comprising:
a first clock frequency determining unit, configured to determine a first clock frequency of a received first clock signal;
a reference determining unit, configured to determine a reference corresponding to the first clock signal, wherein the reference is determined based on at least one of a second clock signal or a timestamp; and
a clock anomaly detection unit, connected to the first clock frequency determining unit and the reference determining unit separately and configured to perform anomaly detection on the first clock signal based on the first clock frequency and the reference;
wherein the reference determining unit comprises a first reference time period determining circuit, configured to determine a first reference time period, wherein the first reference time period is a time period during which a number of pulses of the second clock signal reaches a first count value;
wherein the first clock frequency determining unit comprises a first counter, connected to the clock anomaly detection unit and configured to: perform pulse counting on the first clock signal within the first reference time period to obtain a second count value, and transmit the second count value to the clock anomaly detection unit;
wherein the first reference time period determining circuit comprises:
a second counter, connected to the clock anomaly detection unit and configured to: in response to a first enabling signal, perform pulse counting on the second clock signal until reaching a preset first count value, transmit the first count value to the clock anomaly detection unit, and output a counting completion signal; and a counting control unit, connected to the first counter and the second counter separately and configured to: output the first enabling signal to the first counter and the second counter, output a counting ending instruction to the first counter in response to the counting completion signal, and send a second enabling signal to the clock anomaly detection unit, wherein the counting control unit comprises a delay control circuit.

2. The detection circuit according to claim 1, wherein the reference determining unit further comprises a second reference time period determining circuit, configured to determine a second reference time period, wherein the second reference time period is a time period between respective timestamps of two packets.

3. The detection circuit according to claim 1, wherein the clock anomaly detection unit comprises a first count comparator, configured to compare a count difference with a first preset difference threshold, compare the count difference with a second preset difference threshold to perform anomaly detection on the first clock signal, or both, wherein the count difference is a difference between the first count value and the second count value, and the first preset difference threshold is different from the second preset difference threshold.

4. The detection circuit according to claim 3, further comprising:

a first reference time period configuration unit, connected to the first count comparator and configured to store at least one of the first preset difference threshold or the second preset difference threshold, and transmit at least one of the first preset difference threshold or the second preset difference threshold to the first count comparator.

5. The detection circuit according to claim 1, wherein the first reference time period determining circuit further comprises: a second clock generating unit, connected to the second counter and configured to output the second clock signal to the second counter.

6. The detection circuit according to claim 1, wherein the second reference time period determining circuit comprises:

a time unpacking unit, connected to a first network and configured to parse a packet received from the first network to obtain the timestamp, wherein the packet transmitted via the first network has the timestamp.

7. The detection circuit according to claim 6, wherein the clock anomaly detection unit comprises a second count comparator, the second count comparator comprises a buffer unit, configured to receive the timestamp in response to the second count comparator and store the second count value, and the second count value is received from the first counter.

8. The detection circuit according to claim 6, further comprising:

a second reference time period configuration unit, connected to the clock anomaly detection unit and configured to store a mapping relationship between a timestamp difference and a preset difference threshold, and the clock anomaly detection unit finds the preset difference threshold corresponding to the timestamp difference.

9. The detection circuit according to claim 1, further comprising:

an anomaly handling unit, comprising at least one of the following:

an interrupt signal generating module, configured to output an interrupt signal when the first clock signal is abnormal; or a reset signal generating module, configured to output a reset signal when the first clock signal is abnormal.

* * * * *